United States Patent
Derner et al.

(10) Patent No.: US 10,431,284 B2
(45) Date of Patent: *Oct. 1, 2019

(54) DYNAMIC REFERENCE VOLTAGE DETERMINATION

(71) Applicant: Micron Technology, Inc., Boise, ID (US)

(72) Inventors: Scott James Derner, Boise, ID (US); Christopher John Kawamura, Boise, ID (US); Charles L. Ingalls, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/184,460

(22) Filed: Nov. 8, 2018

(65) Prior Publication Data

US 2019/0147934 A1 May 16, 2019

Related U.S. Application Data

(63) Continuation of application No. 15/844,145, filed on Dec. 15, 2017, now Pat. No. 10,163,483, which is a continuation of application No. 15/276,139, filed on Sep. 26, 2016, now Pat. No. 9,847,117.

(51) Int. Cl.
*G11C 11/22* (2006.01)

(52) U.S. Cl.
CPC ........ *G11C 11/2275* (2013.01); *G11C 11/221* (2013.01); *G11C 11/2273* (2013.01)

(58) Field of Classification Search
CPC .............. G11C 11/2275; G11C 11/221; G11C 11/2273

See application file for complete search history.

(56) References Cited

U.S. PATENT DOCUMENTS

| | | | |
|---|---|---|---|
| 5,625,588 A | 4/1997 | Seyyedy et al. | |
| 5,946,238 A | 8/1999 | Campardo et al. | |
| 6,147,895 A | 11/2000 | Kamp | |
| 6,301,175 B1 | 10/2001 | Seyyedy et al. | |
| 6,388,913 B1 | 5/2002 | Kuo et al. | |
| 6,549,473 B2 | 4/2003 | Rolandi et al. | |
| 6,724,658 B2 | 4/2004 | Micheloni et al. | |
| 6,829,160 B1 | 12/2004 | Qi et al. | |
| 6,909,626 B2 | 6/2005 | Torrisi et al. | |
| 7,518,901 B2 | 4/2009 | Shiga et al. | |
| 7,630,263 B2 | 12/2009 | Pio | |
| 9,786,349 B1 * | 10/2017 | Calderoni | G11C 11/2273 |

(Continued)

*Primary Examiner* — Pho M Luu
(74) *Attorney, Agent, or Firm* — Holland & Hart LLP

(57) ABSTRACT

Methods, systems, and devices for operating a ferroelectric memory cell or cells are described. A first value may be written to a first memory cell and a second value may be written to a second memory cell. Each value may have a corresponding voltage when the memory cells are discharged onto their respective digit lines. The voltage on each digit line after a read operation may be temporarily stored at a node in electronic communication with the respective digit line. A conductive path may be established between the nodes so that charge sharing occurs between the nodes. The voltage resulting from the charge sharing may be used to adjust a reference voltage that is used by other components.

20 Claims, 17 Drawing Sheets

(56) References Cited

U.S. PATENT DOCUMENTS

| | | | |
|---|---|---|---|
| 9,847,117 B1 * | 12/2017 | Derner | G11C 11/221 |
| 10,056,129 B1 * | 8/2018 | Sakurai | G11C 11/2257 |
| 10,163,483 B2 * | 12/2018 | Derner | G11C 11/221 |
| 2005/0133844 A1 * | 6/2005 | Paterson | H01L 27/10864 |
| | | | 257/301 |
| 2007/0279980 A1 | 12/2007 | Schippers et al. | |

* cited by examiner

DYNAMIC REFERENCE VOLTAGE DETERMINATION

CROSS REFERENCE

The present Application for Patent is a continuation of U.S. patent application Ser. No. 15/844,145 by Derner et al., entitled "Dynamic Reference Voltage Determination," filed Dec. 15, 2017, now U.S. Pat. No. 10,163,483, issued Dec. 25, 2018, which is a continuation of U.S. patent application Ser. No. 15/276,139 by Derner et al., entitled "Dynamic Reference Voltage Determination," filed Sep. 26, 2016, now U.S. Pat. No. 9,847,117 issued Dec. 19, 2017, assigned to the assignee hereof, and each of which is expressly incorporated by reference in its entirety herein.

BACKGROUND

The following relates generally to memory devices and more specifically to dynamic reference voltage determination.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. A device using FeRAM may use a predetermined reference voltage for sensing the states stored by the FeRAM memory cells. But this predetermined reference voltage may not be tailored to the device. Additionally, this reference voltage may vary with cell characteristics and temperature over time, causing further discrepancy between a preferable reference voltage value and the actual reference voltage value. Using an incorrect reference voltage may corrupt the sensing operations of the device, resulting in inaccurate reads and decreased performance.

BRIEF DESCRIPTION OF THE DRAWINGS

The disclosure herein refers to and includes the following figures.

DETAILED DESCRIPTION

Figure 1:
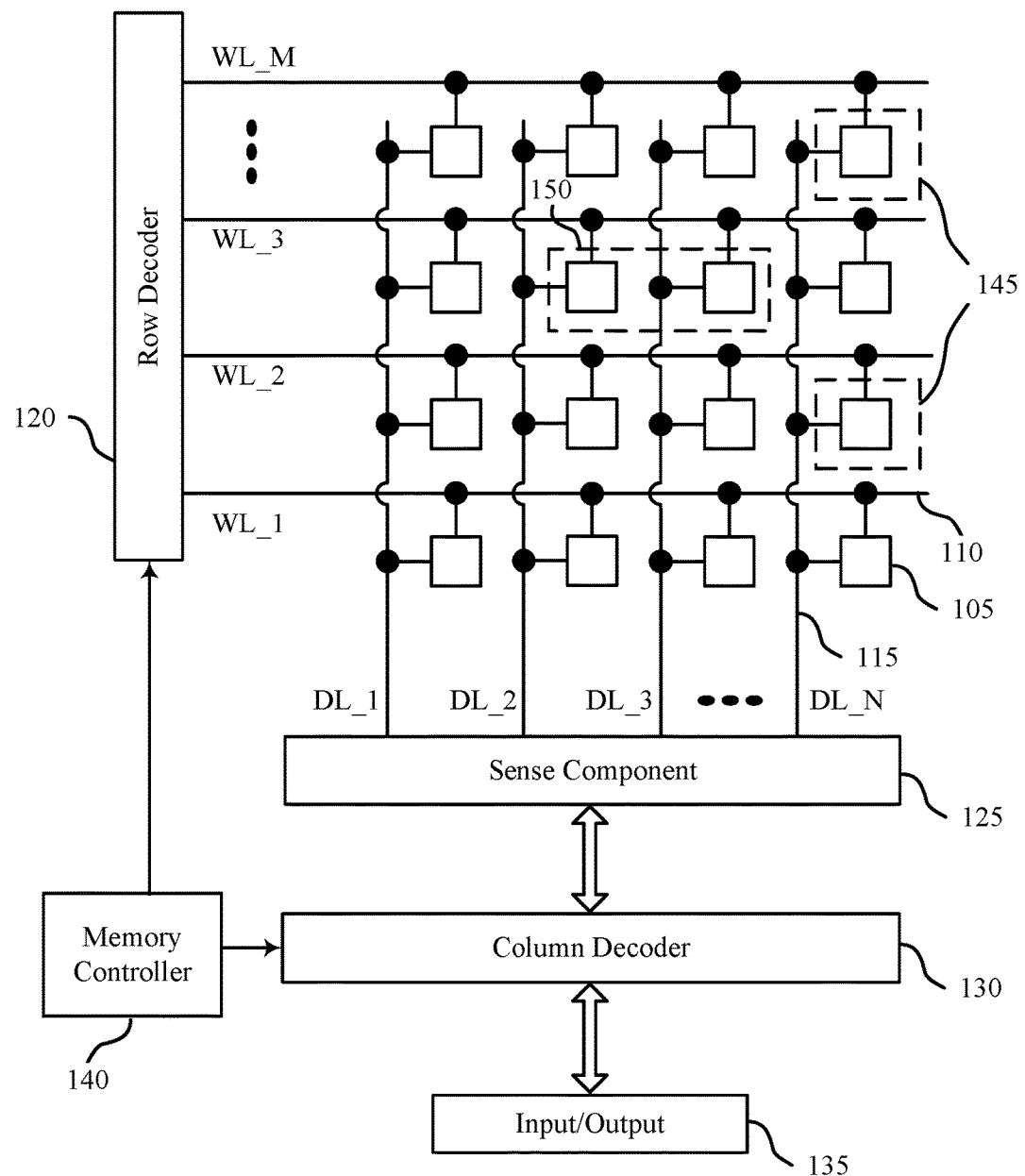
FIG. 1 illustrates an example of a memory array that supports dynamic reference voltage determination in accordance with embodiments of the present disclosure.

A device-specific or array-specific reference voltage may be determined and maintained by using memory cells of the device. For example, the memory cells of an array may be set to opposite states to facilitate charge-sharing between the memory cells, providing a voltage that varies with the cell characteristics and temperature. The device may use this voltage to adjust, or determine, a reference voltage for another array of the device.

Memory cells, including ferroelectric memory cells, within a memory array may be accessed by a word line and a digit line. Access includes writing to a cell (e.g., storing a logic state) or reading a cell (e.g., reading a stored logic state). Each cell may have a storage component, for example a ferroelectric capacitor, that is used to store a logic value of the cell. For example, each cell may store either a logic 0 or a logic 1. Each stored logic value may correspond to a respective state of the cell and may produce a signal (e.g., a voltage) on a digit line of the cell. For example, a stored logic 1 may correspond to a first digit line voltage and a stored logic 0 may correspond to a second digit line voltage. The digit line may connect multiple memory cells and may be connected to a sense amplifier that, when activated during a read operation, is used to determine the stored logic state of a memory cell. For example, an activated sense amplifier may compare the signal (e.g., voltage) extracted from the cell to a reference signal.

The reference signal may be a voltage that has a value halfway (or nearly halfway) between the respective digit line voltages for a logic 0 and a logic 1. But the digit line voltages for each cell state (e.g., stored logic 1 or logic 0) may vary from device to device. So there may be a discrepancy between a predetermined (e.g., factory-set) voltage reference and a more accurate reference voltage for an array. Additionally, the reference voltage for an array may fluctuate over time due to variations in temperature, cell use and cell characteristics. Thus, an array may use a set of cells in its memory array to dynamically generate a voltage that is specific to the device and/or the operating conditions, which in turn can be used to tune a reference voltage of the device.

As described herein, cells in a ferroelectric memory array may be initialized to alternating states. For example, alternating cells may be used to store logic 1s and logic 0s. The cells may be accessed so that digit lines of the cells charge to voltages that correspond to each respective stored state. The voltages on the digit lines may be used to generate a new voltage that is between the original voltage values. This voltage may be processed by the device (e.g., in a memory controller) and used to adjust a reference voltage for other operations (e.g., sense operations) of the array.

Embodiments of the disclosure introduced above are further described below in the context of a memory array. Specific examples are then described for reference voltage adjustment and determination. These and other embodiments of the disclosure are further illustrated by and described with reference to apparatus diagrams, system diagrams, and flowcharts that relate to cell-based reference voltage adjustment and determination.

FIG. 1 illustrates an example memory array 100 that supports dynamic reference voltage determination in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may include a capacitor to store a charge representative of the programmable states; for example, a charged and uncharged capacitor may represent two logic states, respectively. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting the appropriate word line 110 and digit line 115. Word lines 110 may also be referred to as access lines and digit lines 115 may also be referred to as bit lines. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. The discharging may induce a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (e.g., pre-charge, read, write, sample, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

In some cases, a set of memory cells 105 may be operated so that a voltage is produced which can be used to adjust the reference voltage for other memory cells 105 (e.g., memory cells uninvolved in the production of the adjustment voltage). The set of memory cells 105 may be part of array 100 or external to array 100 (e.g., the set of memory cells may be accessed by different word line(s) 110 and digit line(s) 115 than the memory cells 105 of array 100). In other cases, the set of memory cells may at the periphery of array 100. For instance, the memory cells 105 may be edge memory cells (e.g., edge memory cells 145) whose digit lines would either be floating or hard-wired to a voltage source (e.g., VCC/2) in a conventional memory array 100 architecture (e.g., rather than connected to sense component 125). In other cases, the memory cells 105 may be a set of cells that are exclusive of edge cells (e.g., the memory cells 105 may be memory cells 105 that are internal to the edge cells, such as internal memory cells 150). Using the techniques described herein, a reference voltage may be determined (e.g., adjusted) based on voltage generated using two memory cells 105, which may be referred to herein as the adjustment or tuning voltage. However, any number of memory cells 105 may be used in the generation of the adjustment voltage. In some cases, increasing the number of memory cells 105 used to produce the adjustment voltage may increase the accuracy and stability of the adjustment voltage.

Figure 2:
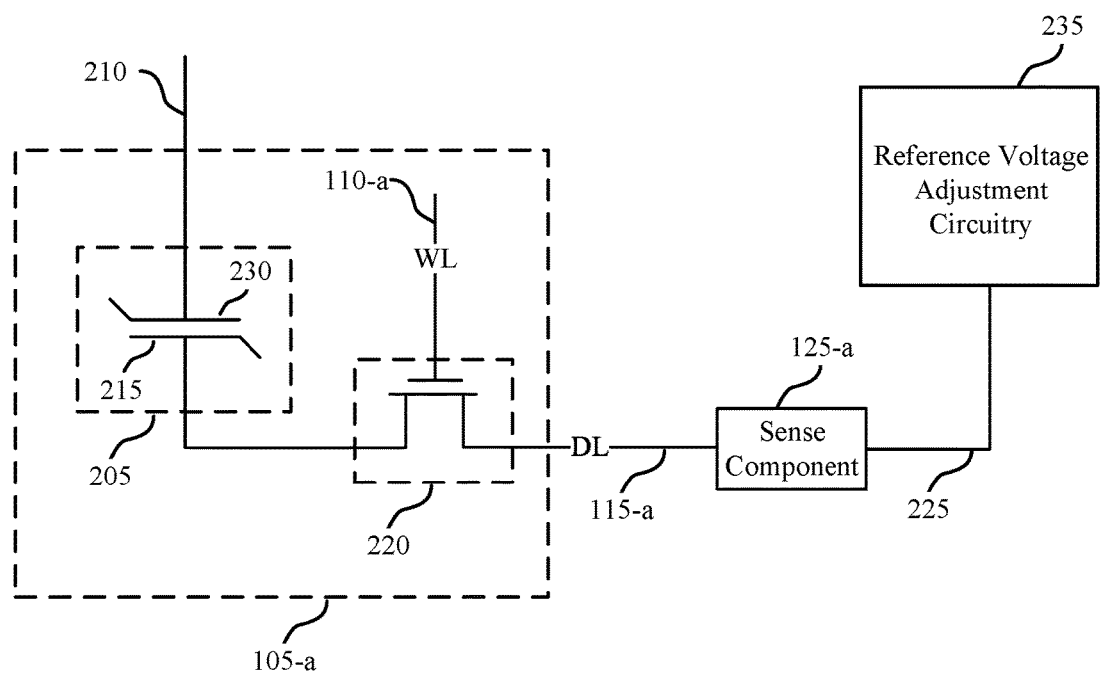
FIG. 2 illustrates an example circuit of a memory cell that supports dynamic reference voltage determination in accordance with embodiments of the present disclosure.

FIG. 2 illustrates an example circuit 200 of a memory cell that supports dynamic reference voltage determination in accordance with various embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225. Cell plate 230 may be accessed via plate line 210 and cell bottom 215 may be accessed via digit line 115-a. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a.

In other examples, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-*a* may be biased to select memory cell 105-*a* and a voltage may be applied to plate line 210. In some cases, digit line 115-*a* is virtually grounded and then isolated from the virtual ground, which may be referred to as "floating," prior to biasing plate line 210 and word line 110-*a*. Biasing plate line 210 may result in a voltage difference (e.g., plate line 210 voltage minus digit line 115-*a* voltage) across capacitor 205. The voltage difference may yield a change in the stored charge on capacitor 205, where the magnitude of the change in stored charge may depend on the initial state of capacitor 205— e.g., whether the initial state stored a logic 1 or a logic 0. This may cause a change in the voltage of digit line 115-*a* based on the charge stored on capacitor 205. Operation of memory cell 105-*a* by varying the voltage to cell plate 230 may be referred to as "moving cell plate."

The change in voltage of digit line 115-*a* may depend on its intrinsic capacitance. That is, as charge flows through digit line 115-*a*, some finite charge may be stored in digit line 115-*a* and the resulting voltage depends on the intrinsic capacitance. The intrinsic capacitance may depend on physical characteristics, including the dimensions, of digit line 115-*a*. Digit line 115-*a* may connect many memory cells 105 so digit line 115-*a* may have a length that results in a non-negligible capacitance (e.g., on the order of picofarads (pF)). The resulting voltage of digit line 115-*a* may then be compared to a reference (e.g., a voltage of reference line 225) by sense component 125-*a* in order to determine the stored logic state in memory cell 105-*a*. Other sensing processes may be used.

Sense component 125-*a* may include various transistors or amplifiers to detect and amplify a difference in signals, which may be referred to as latching. Sense component 125-*a* may include a sense amplifier that receives and compares the voltage of digit line 115-*a* and reference line 225, which may be a reference voltage. The sense amplifier output may be driven to the higher (e.g., a positive) or lower (e.g., negative or ground) supply voltage based on the comparison. For instance, if digit line 115-*a* has a higher voltage than reference line 225, then the sense amplifier output may be driven to a positive supply voltage. In some cases, the sense amplifier may additionally drive digit line 115-*a* to the supply voltage. Sense component 125-*a* may then latch the output of the sense amplifier and/or the voltage of digit line 115-*a*, which may be used to determine the stored state in memory cell 105-*a*, e.g., logic 1. Alternatively, if digit line 115-*a* has a lower voltage than reference line 225, the sense amplifier output may be driven to a negative or ground voltage. Sense component 125-*a* may similarly latch the sense amplifier output to determine the stored state in memory cell 105-*a*, e.g., logic 0. The latched logic state of memory cell 105-*a* may then be output, for example, through column decoder 130 as output 135 with reference to FIG. 1.

To write memory cell 105-*a*, a voltage may be applied across capacitor 205. Various methods may be used. In one example, selection component 220 may be activated through word line 110-*a* in order to electrically connect capacitor 205 to digit line 115-*a*. A voltage may be applied across capacitor 205 by controlling the voltage of cell plate 230 (through plate line 210) and cell bottom 215 (through digit line 115-*a*). To write a logic 0, cell plate 230 may be taken high, that is, a positive voltage may be applied to plate line 210, and cell bottom 215 may be taken low, e.g., virtually grounding or applying a negative voltage to digit line 115-*a*. The opposite process is performed to write a logic 1, where cell plate 230 is taken low and cell bottom 215 is taken high.

In some cases, the voltages output by memory cells 105 may vary with cell characteristics and operating conditions. But the reference voltage used for sensing operations may be impervious to such changes. Over time, the reference voltage may become less representative of the ideal value. According to the techniques described herein, an adjustment voltage may be generated which reflects variations in operating conditions in the same manner as the voltages sensed from memory cells 105. For example, the adjustment voltage may be generated using memory cells 105 that react to various operating conditions in the same manner as the memory cells 105 that are read using the reference voltage. The memory cells 105 that are used to generate the adjustment voltage may be part of reference voltage adjustment circuitry 235. Reference voltage adjustment circuitry 235 may output the adjustment voltage and pass it to sense component 125-*a* via reference line 225. Sense component 125-*a* may use the adjustment voltage to tune or otherwise modify the reference voltage used for sense operations of other memory cells 105 (e.g., memory cell 105-*a*). For example, if a first scenario causes the adjustment voltage to increase with respect its original value, sense component 125-*a* may increase the reference voltage to compensate for the corresponding increase in output voltages from memory cells 105. If a subsequent scenario causes the adjustment voltage to decrease, sense component 125-*a* may decrease the reference voltage to compensate for the corresponding increase in output voltages from memory cells 105. Thus, the reference voltage may be dynamically determined, and may reflect changes in operating conditions and cell characteristics. In some cases, a first plurality of memory cells 105 and a second plurality of memory cells 105 may generate the reference voltage.

Figure 3:
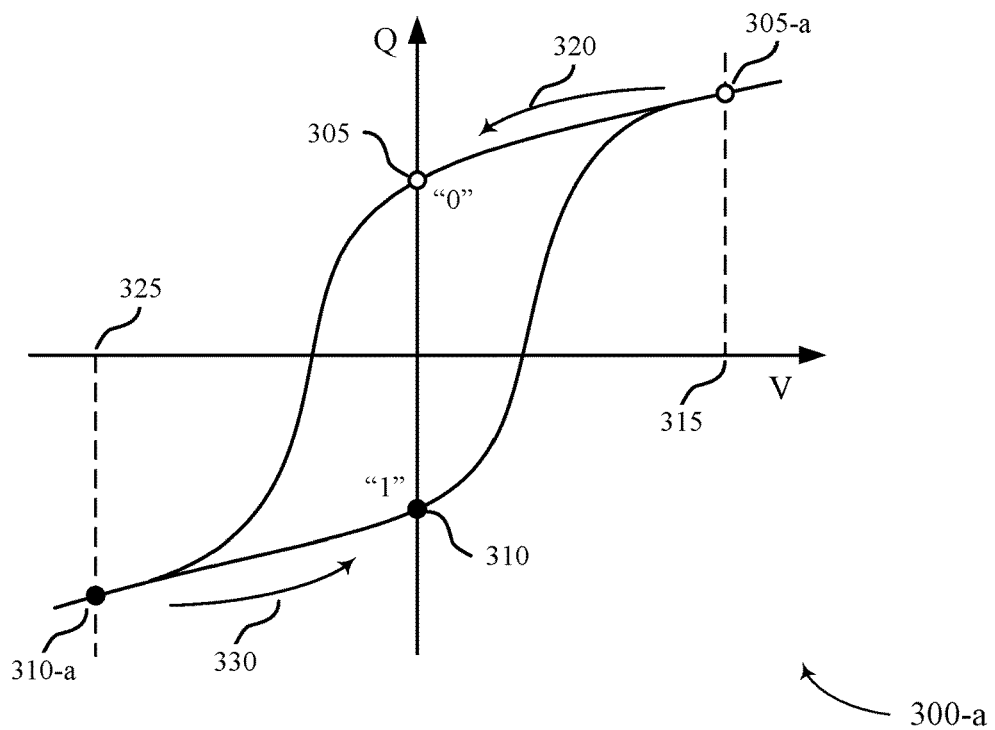
FIG. 3 illustrates an example of a hysteresis plot for a ferroelectric memory cell that supports dynamic reference voltage determination in accordance with embodiments of the present disclosure.
Figure 3:
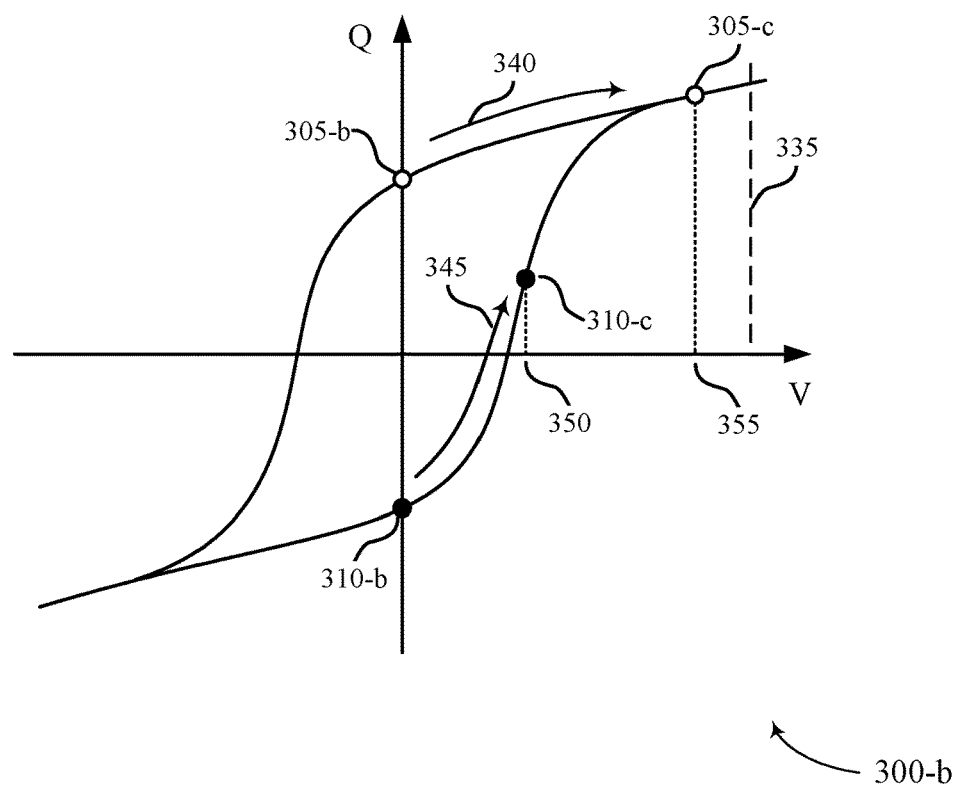

FIG. 3 illustrates an example of non-linear electrical properties with hysteresis curves 300-*a* and 300-*b* for a ferroelectric memory cell that is operated in accordance with various embodiments of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335–voltage 350) or (voltage 335–voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335–voltage 350) and (voltage 335–voltage 355). Upon comparison by the sense component, the sensed digit line voltage may be determined to be higher or lower than the reference voltage, and the stored logic value of the ferroelectric memory cell (i.e., a logic 0 or 1) may be determined.

In some cases, variations in cell characteristics (e.g., ferroelectric materials) and operating conditions may result in variations in voltage 350 or voltage 355. As described herein, the variations in voltage 350 and voltage 355 output from a memory cell 105 may be accounted for by using a dynamically determined reference voltage. The reference voltage may be tuned or otherwise adjusted by a voltage generated from cells 105 having the same characteristics and operating under the same conditions as the memory cell 105 that is being sensed.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction.

Figure 4:
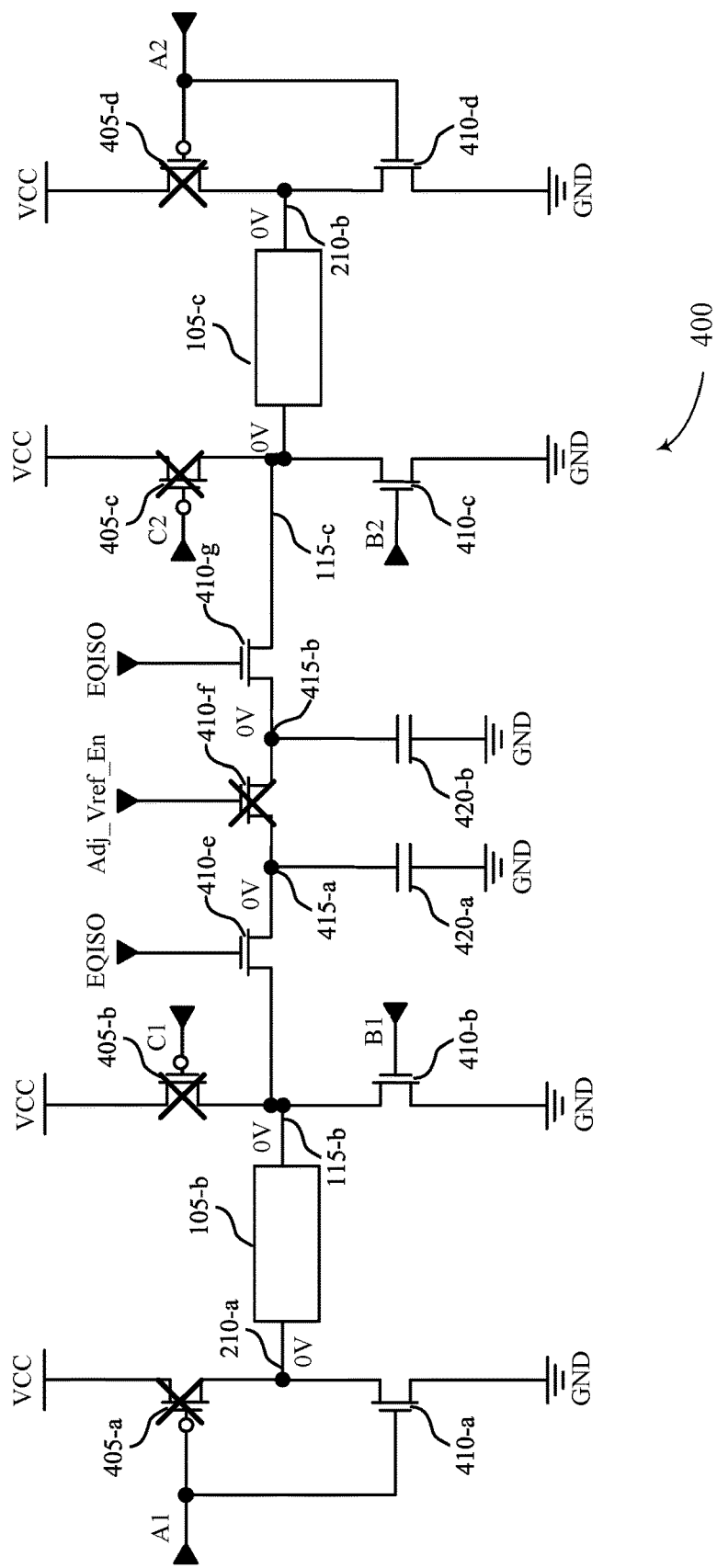
FIG. 4 illustrates an example circuit during a pre-charge operation that supports dynamic reference voltage determination in accordance with embodiments of the present disclosure.
Figure 5:
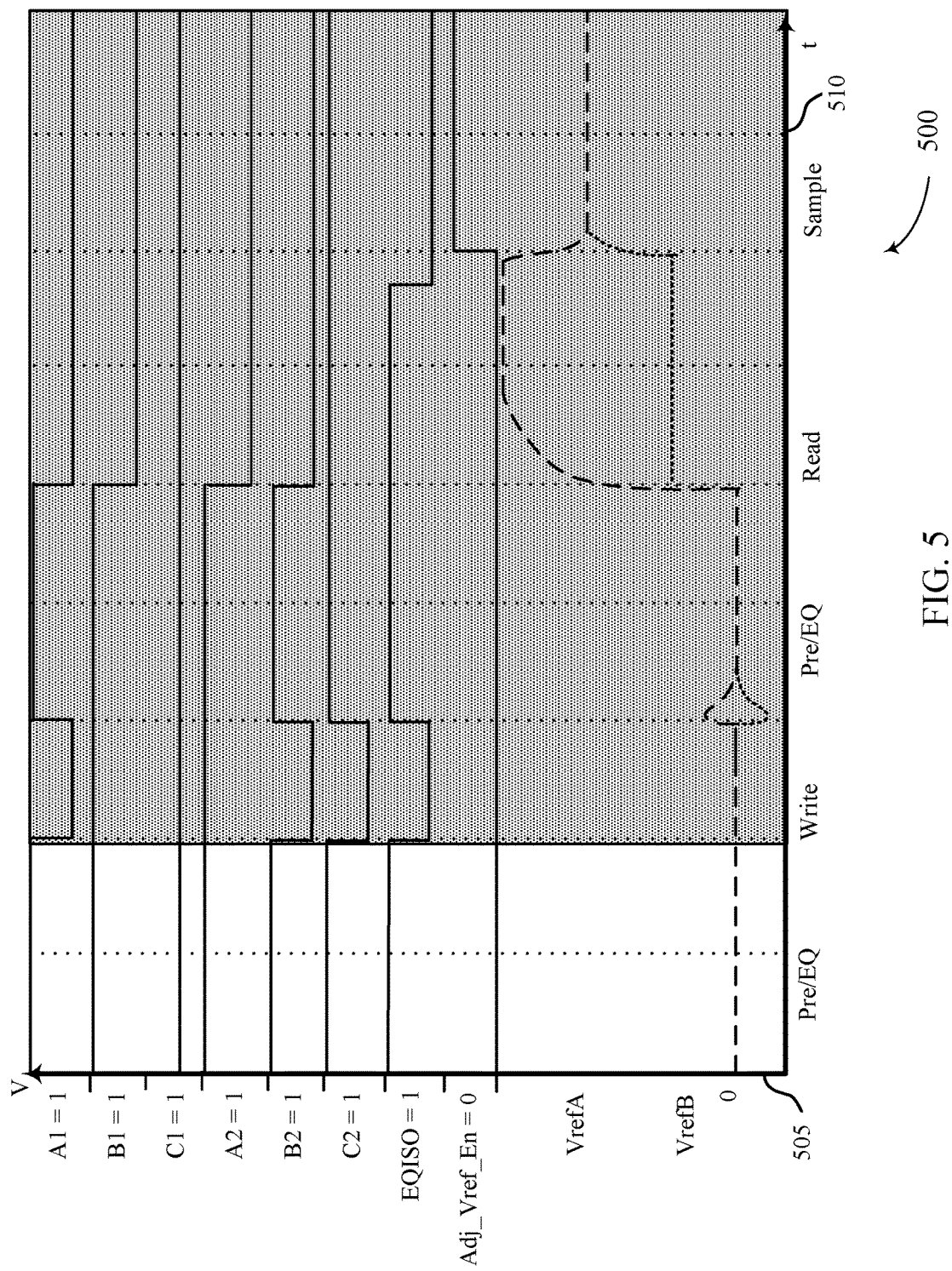
FIG. 5 illustrates an example of a timing diagram during a pre-charge operation that supports dynamic reference voltage determination in accordance with embodiments of the present disclosure.

FIG. 4 illustrates an example circuit 400 during a pre-charge operation that supports dynamic reference voltage determination in accordance with various embodiments of the present disclosure. Circuit 400 may be part of an memory array that generates a voltage that can be used to adjust a reference voltage (e.g., for use at a different memory array). In some cases, circuit 400 may be part of, or an example of, reference voltage adjustment circuitry 235 described with reference to FIG. 2. Circuit 400 includes a number of components, the states of which (e.g., whether they are activated or deactivated) are shown with a strike through (i.e., an "X") of components that are deactivated and no strike through of components that are activated. The states of the components shown in circuit 400 may correspond to a pre-charge or equalization operation that occurs prior to writing or reading the circuit 400. The waveforms used to place circuit 400 in a pre-charged or equalization state are shown in FIG. 5 and described in the corresponding discussion.

Circuit 400 includes memory cell 105-b and memory cell 105-c, which may be examples of a memory cell 105 described with reference to FIGS. 1-3. Each memory cell 105 may be accessed using a corresponding word line (not shown). Memory cell 105-b may be accessed using a word line that is common between memory cell 105-b and memory cell 105-c or using a word line that is specific to memory cell 105-b. Although two memory cells 105 are shown, the techniques described herein may be implemented for multiple memory cells 105. For example, additional memory cells 105 may be place in parallel with memory cell 105-b and additional memory cells 105 may be placed in parallel with memory cell 105-c. A memory cell 105 in parallel with memory cell 105-c may include a plate line that is connected to plate line 210-a of memory cell 105-b and a digit line that is connected to digit line 115-b of memory cell 105-c). Using more memory cells 105 may decrease susceptibility to noise, which in turn may increase the accuracy of the generated reference voltage.

Circuit 400 may also include a number of switching components, such as p-type transistors 405 and n-type transistors 410 (collectively, a plurality of transistors) Although described with reference to transistors, the techniques described herein may be implemented using other types of devices. Additionally, the type of transistor used can vary. Each transistor may be activated (e.g., turned on) by controlling the voltage applied at the gate of the transistor. For example, a transistor 410 may be activated by applying a voltage (e.g., a ground reference voltage) to the gate of the transistor 410 and a transistor 405 may be activated by applying a voltage (e.g., a positive voltage) to the gate of the transistor 405. The voltage applied may satisfy the threshold voltage requirements to turn the respective transistor on. In some cases, a controller may coordinate the application of voltages to the gates of the transistors in circuit 400.

In some cases, one or more voltage sources may be used to control the voltage applied at the gates of the transistors (e.g., the gate of each transistor may be connected, for instance hard-wired, to a voltage supply). When activated, a transistor may enable the flow of current (i.e., electrons) between two components; when deactivated, the switching component may prevent the flow of current between the two components. The voltage applied to the gates of transistor 405-a and transistor 410-a may be denoted A1 and the voltage applied to the gates of transistor 405-d and transistor 410-d may be denoted A2. Similarly, the voltage applied to the gate of transistor 405-b may be denoted C1, the voltage applied to the gate of transistor 410-b may be denoted B1, the voltage applied to the gate of transistor 405-c may be denoted C2, and the voltage applied to the gate of transistor 410-c may be denoted B2. EQISO may refer to the voltage applied at transistor 410-e and 410-g, and Adj_Vref_En may refer to the voltage applied at the gate of transistor 410-f. The voltages applied to the gates of the switching components of circuit 400 may be controlled by a controller and may be supplied by the same or different voltage sources. The source of each transistor 405 or 410 may be connected to (e.g., in electronic communication with or hard-wired to) a voltage source, such as positive rail voltage VCC or virtual ground reference (GND). Thus, sets of transistors (e.g., a first set and a second set of a plurality of transistors) may be activated.

Circuit 400 may also include capacitors 420 (e.g., dielectric or ferroelectric capacitors) which are in electronic communication with the memory cells 105. Capacitors 420 may be used to temporarily store charge from memory cells 105. For example, capacitor 420-a may be used to store a charge from memory cell 105-b that corresponds to a first stored value and capacitor 420-b may be used to store a charge from memory cell 105-c that corresponds to a second stored value. Although described with reference to discrete capacitors, in some cases the charge from memory cells 105 may be stored at nodes 415-a and 415-b using the intrinsic capacitance of the conductive line between transistor 410-e and transistor 410-f.

When transistor 410-f is activated, charge-sharing may occur between capacitor 420-a and capacitor 420-b as they discharge. The resulting voltage may be used to adjust a reference voltage for other components of the device in which circuit 400 is located. Prior to activation of transistor 410-f, the components of circuit 400 may undergo a series of operations, including write, read, and pre-charge operations. For example circuit 400 may undergo, in order: a pre-charge operation, a write operation, another pre-charge operation, a read operation, and a sample operation. The pre-charge operation is described with reference to FIGS. 4 and 5, and the other operations are described in FIGS. 6-13.

As described herein, circuit 400 may undergo a pre-charge operation. During the pre-charge operation, the voltages at various nodes may be zeroed by activating and deactivating certain components. For example, plate line 210-a may be pre-charged to 0V by deactivating transistor 405-a and activating transistor 410-a and the voltage on plate line 210-b may be pre-charged to 0V by deactivating transistor 405-d and activating transistor 410-d. Similarly, digit line 115-b may be pre-charged to 0V by deactivating transistor 405-b and activating transistor 410-b and the voltage on digit line 115-c may be pre-charged to 0V by deactivating transistor 405-c and activating transistor 410-c. Node 415-a may be pre-charged to 0V by activating transistor 410-e and node 415-b may be pre-charged to 0V by activating transistor 410-g. Node 415-a and node 415-b may be isolated from each other by deactivating transistor 410-f. The pre-charge operation depicted in circuit 400 may facilitate the generation of a voltage that can be used to adjust a reference voltage.

Circuit 400 may be part of a specialized array dedicated to reference voltage determination. In other cases, circuit 400 may be part of a larger array that includes additional functionality (e.g., storage of data bits unassociated with reference voltage determination). For example, circuit 400 may be at the edge or periphery of a memory array whose reference voltage is tuned by the voltage generated by circuit 400. In other cases, circuit 400 may be isolated from the components (e.g., memory arrays or cells) that use the reference voltage. For example, circuit 400 may be accessed by different lines (e.g., digit lines 115, word lines 110) than the memory array(s) that rely on the reference voltage in question. However, circuit 400 may be in electronic communication with components that process the generated voltage (e.g., ADCs, sense amplifiers, etc.) and provide it to the external memory arrays.

The various components of circuit 400 may be coupled with one or more other components. Two components that are coupled may be capable of exchanging charge (or electrons) when a conductive path is established between the two components. The conductive path may temporary or permanent. For instance, transistor 410-e may provide a conductive path between memory cell 105-b and capacitor 420-a when transistor 410-e is activated. Thus, memory cell 105-b and capacitor 420-a are coupled via transistor 410-e. In some cases, the terms "in electronic communication with" and "coupled with" may be used interchangeably.

In another example, a first ferroelectric memory cell (e.g., memory cell 105-b) may be coupled to a first switching component (e.g., transistor 410-e) via a first conductive line such as digit line 115-b. Similarly, a second memory cell, (e.g., memory cell 105-c) may be coupled to a second switching component (e.g., transistor 410-g) via a second conductive line such as digit line 115-c. A third switching component (e.g., transistor 410-f) may be coupled to the first switching component (e.g., transistor 410-e) and the second switching component (e.g., transistor 410-g). The gates of the switching components may be coupled with various voltage sources. For example, the gate of transistor 410-e may be coupled with a first voltage source (e.g., the voltage source that supplies EQISO), the gate of transistor 410-f may be coupled to a second voltage source (e.g., the voltage source that supplies EQISO, or a different voltage source), and the gate of transistor 410-g maybe coupled to a third voltage source (e.g., the voltage source that supplies Adj_Vref_En). In some examples, a plurality of ferroelectric memory cells may be used to generate a reference voltage. So a first plurality of ferroelectric memory cells may each be coupled to the first switching component (e.g., transistor 410-e) via the first conductive line, the first ferroelectric memory cell (e.g., memory cell 105-b) may be a cell of the first plurality; and a second plurality of ferroelectric memory cells may each be coupled to the second switching component (e.g., transistor 410-g), and the second ferroelectric memory cell (e.g., memory cell 105-c) may be a cell of the second plurality of ferroelectric memory cells.

In some cases, a capacitor (e.g., capacitor 420-a) may be coupled to the third switching component (e.g., transistor 410-g) and the first switching component (e.g., transistor 410-e). Oftentimes, a second capacitor is also coupled to the third switching component (e.g., transistor 410-g) and the first switching component (e.g., transistor 410-e). Additionally, a sense amplifier may be in electronic communication with first switching component (e.g., transistor 410-e) and the third switching component (e.g., transistor 410-g). In some examples, the sense amplifier is coupled to an electronic memory array that is separate from circuit 400. As mentioned above, additional memory cells 105 may be added to circuit 400. The additional memory cells 105 may be in parallel with memory cell 105-b and/or memory cell 105-c. For instance, a third ferroelectric memory cell may be connected in parallel with the first ferroelectric memory cell (e.g., memory cell 105-b) and a fourth ferroelectric memory cell may be connected in parallel with the second ferroelectric memory cell (e.g., memory cell 105-c).

FIG. 5 illustrates an example of a timing diagram 500 during a pre-charge operation that supports dynamic reference voltage determination in accordance with various embodiments of the present disclosure. Timing diagram 500 includes voltage represented on axis 505 and time represented on axis 510, and timing diagram 500 depicts an exemplary pre-charge or equalization operation of circuit 400. Each tick mark on axis 505 represents 0V for the voltage of the corresponding node. A pre-charge or equalization operation may place the circuit 400 in a neutral state for a subsequent read or write operation. For example, after circuit 400 undergoes a pre-charge or equalization operation, the various nodes of circuit 400 may be at 0V or virtual ground. The voltages applied to various components of circuit 400 are represented as a function of time on timing diagram 500. For example, timing diagram 500 includes voltages A1, A2, B1, B2, C1, C2, EQISO, and Adj_Vref_En. The relative value of each of the applied voltages for the pre-charge operation is denoted either a 0 or a 1. A value of 1 indicates that the corresponding voltage is high and a value of 0 indicates that the corresponding voltage is low. The voltages of various nodes of circuit 400 are also represented as a function of time on timing diagram 500. For example, timing diagram includes the voltage at node 415-a, referred to herein as VrefA, and the voltage at node 415-b, referred to herein as VrefB.

The pre-charge operation includes activating and deactivating various transistors 405 and 410 in circuit 400. For example, a magnitude of A1 may be applied so that the threshold value of transistor 405-a is not overcome (i.e., transistor 405-a is deactivated) and so that the threshold value of transistor 410-a is overcome (i.e., transistor 410-a is activated). Deactivating transistor 405-a isolates plate line 210-a from VCC and activating transistor 410-a establishes a conductive path between plate line 210-a and GND. Thus, the voltage at plate line 210-a becomes 0V. To generate a neutral voltage (i.e., 0V) at digit line 115-b, a magnitude of C1 may be applied so that the threshold voltage of transistor 405-b is not overcome (i.e., transistor 405-b is deactivated) and digit line 115-b is isolated from VCC. Additionally, a magnitude of B1 may be applied to transistor 410-b so that the threshold voltage of transistor 410-b is overcome (i.e., transistor 410-b is activated) and a conductive path is established between GND and digit line 115-b. Thus, the voltage at digit line 115-b may be 0V, and a voltage difference of 0V may be applied across memory cell 105-b.

To generate 0V at node 415-a, a magnitude of EQISO may be applied so that the threshold voltage of transistor 410-e is overcome (i.e., transistor 410-e is activated) and a conductive path is established between digit line 115-b and node 415-a via transistor 410-e. Thus, the voltage at node 415-a may be 0V. Node 415-a may be isolated from node 415-b via transistor 410-f. For example, a magnitude of Adj_Vref_En may be applied so that the threshold voltage of transistor 410-f is not overcome (i.e., transistor 410-f is deactivated).

A similar process may be used to generate neutral voltages at plate line 210-b, digit line 115-c, and node 415-b. For example, a magnitude of A2 may be applied so that the threshold value of transistor 405-d is not overcome (i.e., transistor 405-d is deactivated) and so that the threshold value of transistor 410-d is overcome (i.e., transistor 410-d is activated). Deactivating transistor 405-d isolates cell plate 210-b from VCC and activating transistor 410-d establishes a conductive path between plate line 210-b and GND. Thus, the voltage at plate line 210-b becomes 0V. To generate a neutral voltage (i.e., 0V) at digit line 115-c, a magnitude of C2 may be applied so that the threshold voltage of transistor 405-c is not overcome (i.e., transistor 405-c is deactivated) and digit line 115-c is isolated from VCC. Additionally, a magnitude of B2 may be applied to transistor 410-c so that the threshold voltage of transistor 410-c is overcome (i.e., transistor 410-c is activated) and a conductive path is established between GND and digit line 115-c. Thus, the voltage at digit line 115-c may be 0V, and a voltage difference of 0V may be applied across memory cell 105-c.

Figure 6:
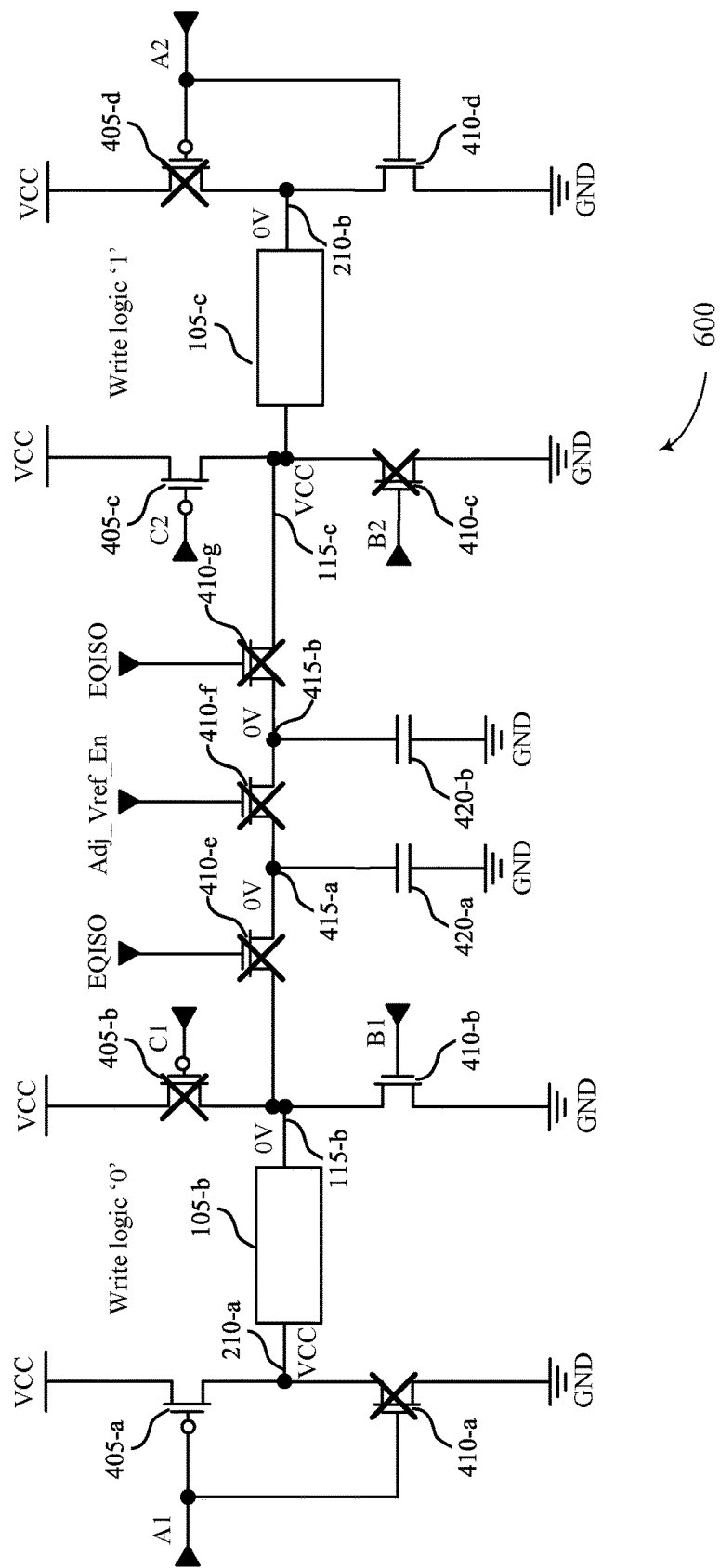
FIG. 6 illustrates an example circuit during a write operation that supports dynamic reference voltage determination in accordance with embodiments of the present disclosure.
Figure 7:
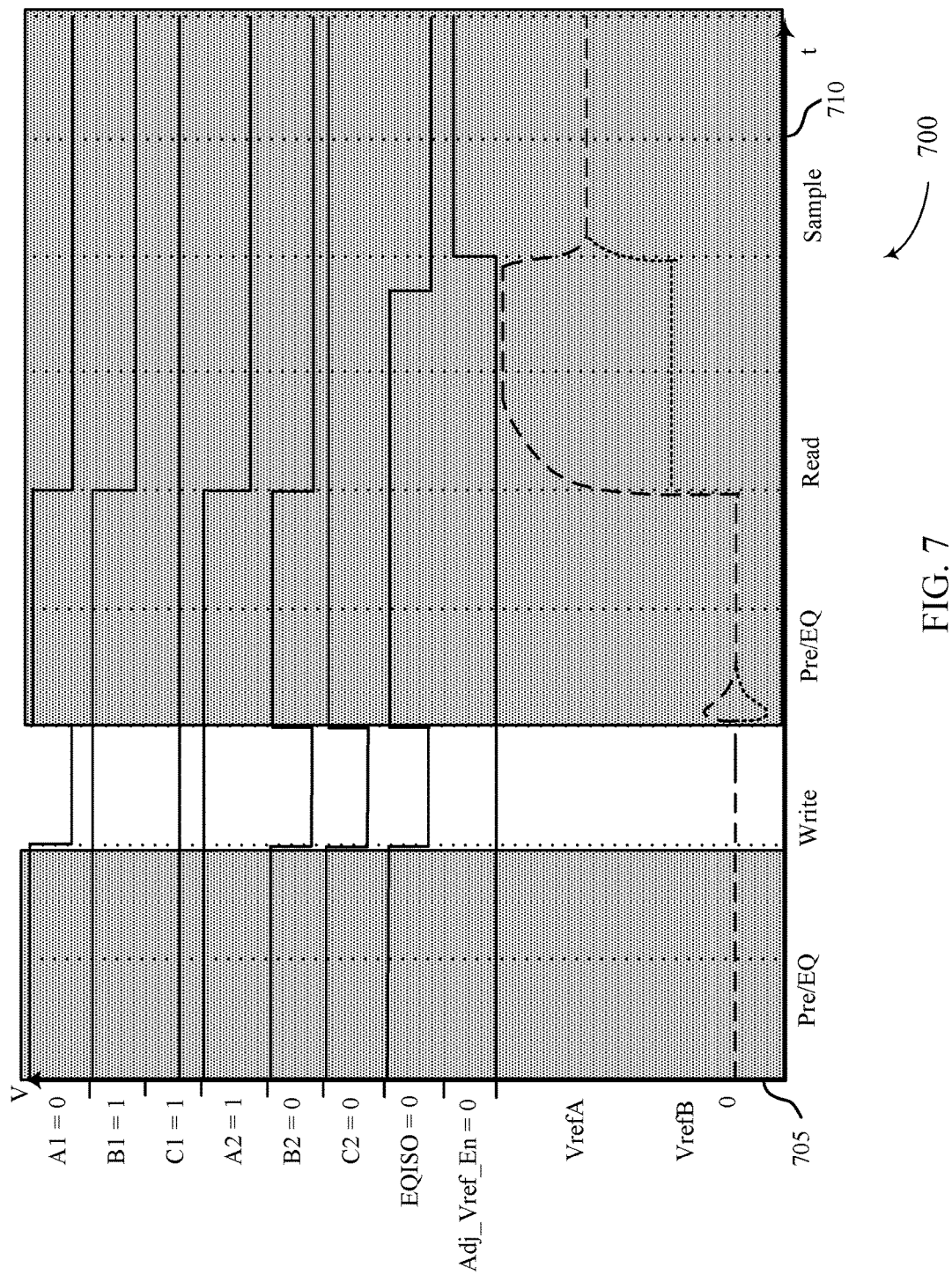
FIG. 7 illustrates an example of a timing diagram during a write operation that supports dynamic reference voltage determination in accordance with embodiments of the present disclosure.

To generate 0V at node 415-b, a magnitude of EQISO may be applied so that the threshold voltage of transistor 410-g is overcome (i.e., transistor 410-g is activated) and a conductive path is established between digit line 115-c and node 415-b via transistor 410-g. Thus, the voltage at node 415-b may be 0V. After completion of the pre-charge operation, circuit 400 may undergo a read operation or a write operation. FIG. 6 shows an example of the circuit 400 during a write operation subsequent to the pre-charge operation illustrated by FIGS. 4 and 5. The waveforms used to write to circuit 600 are shown in FIG. 7 and described in the corresponding discussion.

FIG. 6 illustrates an example circuit 600 during a write operation that supports dynamic reference voltage determination in accordance with various embodiments of the present disclosure. Circuit 600 may be part of a memory array that generates a voltage that can be used to adjust a reference voltage (e.g., for use at a different memory array). Circuit 600 includes a number of components, the states of which (e.g., whether they are activated or deactivated) are shown with a strike through (i.e., an "X") of components that are deactivated and no strike through of components that are activated. The states of the components shown in circuit 600 may correspond to a write operation that occurs subsequent a pre-charge operation of the circuit 600, such as described with reference to FIGS. 4 and 5. The waveforms used to perform a write operation on circuit 600 are shown in FIG. 7 and described in the corresponding discussion.

As described herein, memory cell 105-b and memory cell 105-c may be written to different states that correspond to different logic values. During the write operation, a positive voltage may be applied across memory cell 105-b by activating transistors 405-a and 410-b and deactivating transistors 410-a and 405-b. Thus, a logic 0 may be written to memory cell 105-b. Also during the write operation, a negative voltage may be applied across memory cell 105-c by activating transistors 410-d and 405-c and deactivating transistors 405-d and 410-c. Thus, a logic 1 may be written to memory cell 105-c. The digit lines 115 and nodes 415 may be isolated from each other by deactivating transistor 410-e, transistor 410-f, and transistor 410-g.

In some cases, the logic value written to each memory cell 105 may be different for different write operations. Toggling the logic value written to a memory cell 105 may prevent imprint, which may occur when ferroelectric domains drift due to extended exposure to, or storage of, the same charge. For example, a ferroelectric memory cell 105 storing the same logic state for an extended period (e.g., hours, days, months, etc.) may experience a shifting of ferroelectric domains within an associated ferroelectric capacitor. This imprint may negatively affect subsequent read and write operations from and to the ferroelectric memory cell 105. According to the techniques described herein, alternating states may be stored at a memory cell 105 to prevent or mitigate imprint. In the example described above, a logic 0 is written to memory cell 105-b and a logic 1 is written to memory cell 105-c. These values may be subsequently read from their corresponding memory cell 105 during a reference voltage determination procedure. In some cases, the read operation may destroy one or more of the values stored by the memory cells 105. Thus, the memory cell(s) may be re-written to prepare for a future reference voltage determination operation. Rather than re-writing the same logic value to the same memory cell 105, however, and risking imprint, the polarity of the logic values stored at the memory cells 105 may be switched so that a logic 1 is written to memory cell 105-b and so that a logic 0 is written to memory cell 105-c. Thus, a logic 1 may be written to memory cell 105-b after a logic 0 has been read from memory cell 105-b and a logic 0 may be written to memory cell 105-c after a logic 1 has been read from memory cell 105-b. Storing alternating states at the memory cells 105 may reduce imprinting.

Processes similar to those described with reference to FIG. 6 may be used to write a logic 1 to memory cell 105-b and a logic 0 to memory cell 105-c. However, different transistors may be activated and deactivated. For example, a negative voltage may be applied across memory cell 105-b by deactivating transistors 405-a and 410-b and activating transistors 410-a and 405-b. Thus, a logic 1 may be written to memory cell 105-b. A positive voltage may be applied across memory cell 105-c by deactivating transistors 410-d and 405-c and activating transistors 405-d and 410-c. Thus, a logic 1 may be written to memory cell 105-c.

FIG. 7 illustrates an example of a timing diagram 700 during a write operation that supports dynamic reference voltage determination in accordance with various embodiments of the present disclosure. Timing diagram 700 includes voltage represented on axis 705 and time represented on axis 710, and timing diagram 700 depicts an exemplary write operation of circuit 600. Each tick mark on axis 705 represents 0V for the voltage of the corresponding node. The write operation depicted in timing diagram 700 may write opposite logic values to the memory cells 105 of circuit 600. For example, after circuit 400 undergoes the write operation, memory cell 105-b may store a logic 0 and memory cell 105-c may store a logic 1.

The write operation includes activating and deactivating various transistors 405 and 410 in circuit 600. For example, a magnitude of A1 may be applied so that the threshold value of transistor 405-a is overcome (i.e., transistor 405-a is activated) and so that the threshold value of transistor 410-a is not overcome (i.e., transistor 410-a is deactivated). Activating transistor 405-a establishes a conductive path between plate line 210-a and VCC and deactivating transistor 410-a isolates plate line 210-a from GND. Thus, the voltage at plate line 210-a may be VCC. To apply a positive voltage across memory cell 105-b, a neutral voltage (i.e., 0V) is produced at digit line 115-b. For example, a magnitude of C1 may be applied so that the threshold voltage of transistor 405-b is not overcome (i.e., transistor 405-b is deactivated) and digit line 115-b is isolated from VCC. Additionally, a magnitude of B1 may be applied to transistor 410-b so that the threshold voltage of transistor 410-b is overcome (i.e., transistor 410-b is activated) and a conductive path is established between GND and digit line 115-b. Thus, the voltage at digit line 115-b may be 0V, and a voltage difference of VCC−0V=VCC may be applied across memory cell 105-b, preparing memory cell 105-b to store a logic 0. The logic 0 may be effectively stored at memory cell 105-b upon completion of a pre-charge operation such a described with reference to FIGS. 4 and 5.

To prepare memory cell 105-c to store a logic 1, a negative voltage may be applied across memory cell 105-c. For example, a magnitude of A2 may be applied so that the threshold value of transistor 405-d is not overcome (i.e., transistor 405-d is deactivated) and so that the threshold value of transistor 410-d is overcome (i.e., transistor 410-d is activated). Deactivating transistor 405-d isolates cell plate 210-b from VCC and activating transistor 410-d establishes a conductive path between plate line 210-b and GND. Thus, the voltage at plate line 210-b may be 0V. To generate a positive voltage (e.g., VCC) at digit line 115-c, and an overall negative voltage across memory cell 105-c, a magnitude of C2 may be applied so that the threshold voltage of transistor 405-c is overcome (i.e., transistor 405-c is activated) and a conductive path is established between digit line 115-c and VCC. Additionally, a magnitude of B2 may be applied so that the threshold voltage of transistor 410-c is not overcome (i.e., transistor 410-c is deactivated) and digit line 115-c is isolated from GND. Thus, the voltage at digit line 115-c may be VCC, and a voltage difference of 0V−VCC=−VCC may be applied across memory cell 105-c.

Figure 8:
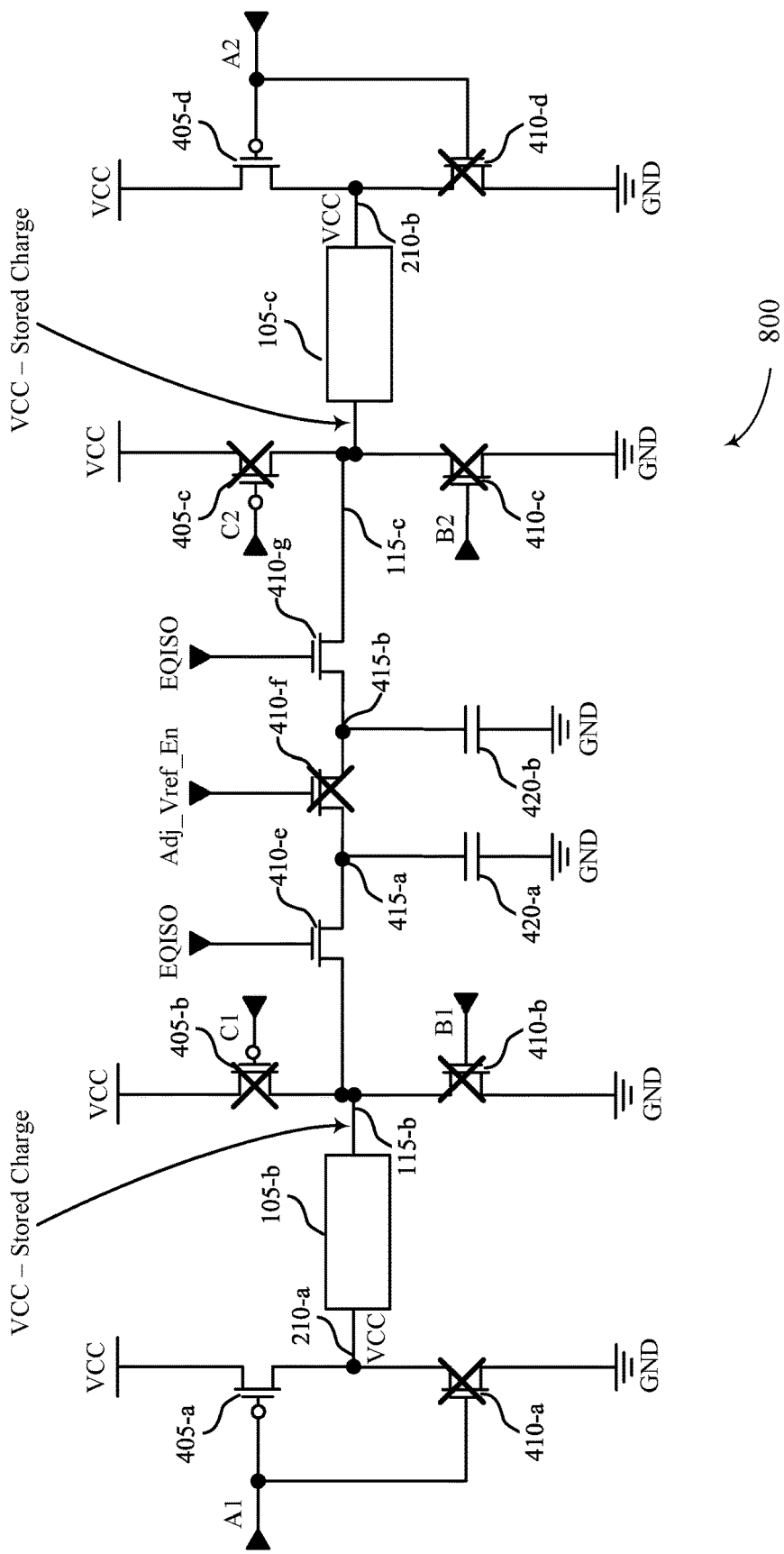
FIG. 8 illustrates an example circuit during a read operation that supports dynamic reference voltage determination in accordance with embodiments of the present disclosure.

To maintain 0V at node 415-a and node 415-b, a magnitude of EQISO may be applied so that the threshold voltage of transistor 410-e is not overcome (i.e., transistor 410-e is deactivated) and digit line 115-b is isolated from node 415-a via transistor 410-e. Thus, the voltage at node 415-a may be 0V. Node 415-a may be isolated from node 415-b via transistor 410-f. For example, a magnitude of Adj_Vref_En may be applied so that the threshold voltage of transistor 410-f is not overcome (i.e., transistor 410-f is deactivated). To maintain 0V at node 415-b, a magnitude of EQISO may be applied so that the threshold voltage of transistor 410-g is not overcome (i.e., transistor 410-*g* is deactivated) and digit line 115-*c* is isolated from node 415-*b* via transistor 410-*g*. Thus, the voltage at node 415-*b* may be 0V. After completion of the write operation, circuit 600 may undergo a pre-charge operation similar to the pre-charge operation depicted in FIGS. 4 and 5. The duration of the pre-charge operation may vary (e.g., based on cell characteristics and/or environmental factors such as temperature). After the pre-charge operation, memory cell 105-*b* and memory cell 105-*c* may undergo a read operation. FIG. 8 shows an example of the circuit 800 during a read operation subsequent to the write and pre-charge operations. The waveforms used to read to circuit 800 are shown in FIG. 9 and described in the corresponding discussion.

FIG. 8 illustrates an example circuit 800 during a read operation that supports dynamic reference voltage determination in accordance with various embodiments of the present disclosure. Circuit 800 may be part of a memory array that generates a voltage that can be used to adjust a reference voltage (e.g., for use at a different memory array). Circuit 800 includes a number of components, the states of which (e.g., whether they are activated or deactivated) are shown by striking through components that are deactivated. The states of the components shown in circuit 800 may correspond to a read operation that occurs subsequent write and pre-charge operations of the circuit 800, such as described with reference to FIGS. 4-7. Thus, memory cell 105-*b* may store a logic 1 and memory cell 105-*c* may store a logic 0. The waveforms used to perform a read operation on circuit 800 are shown in FIG. 9 and described in the corresponding discussion.

During the read operation, a positive voltage may be applied to plate line 210-*a* (e.g., by activating transistor 405-*a* and deactivating transistor 410-*a*) so that memory cell 105-*b* discharges onto digit line 115-*b*. Similarly, a positive voltage may be applied to plate line 210-*b* (e.g., by activating transistor 405-*d* and deactivating transistor 410-*d*) so that memory cell 105-*c* discharges onto digit line 115-*c*. Additionally, transistor 410-*e* and transistor 410-*g* may be activated so that the voltage at node 415-*a* is the voltage of digit line 115-*b* and the voltage at node 415-*b* is the voltage of digit line 115-*c*. Transistor 410-*e* and transistor 410-*g* may be deactivated during a sample operation that occurs after the read operation. Transistor may be deactivated until the sample operation.

Figure 9:
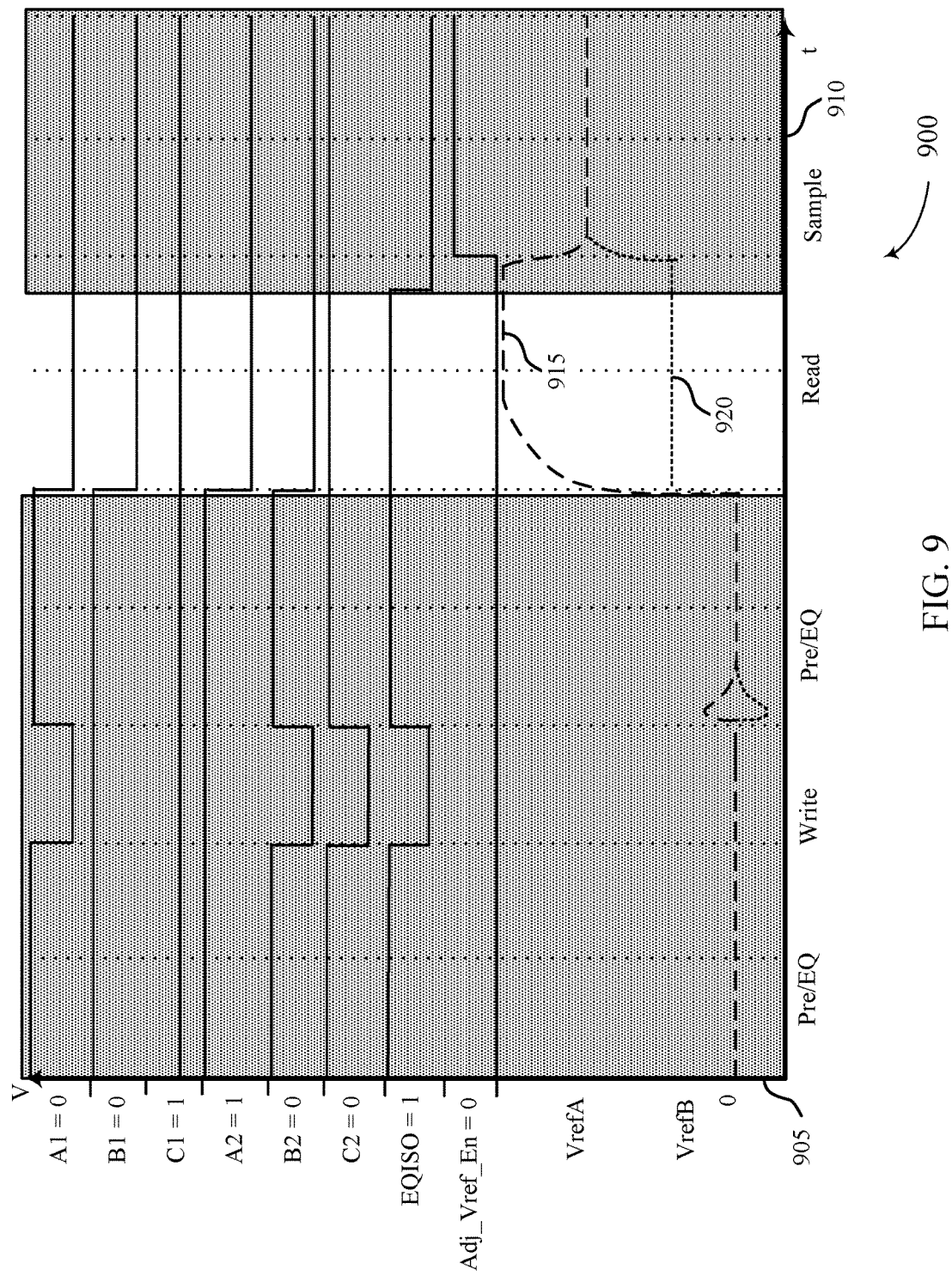
FIG. 9 illustrates an example of a timing diagram during a read operation that supports dynamic reference voltage determination in accordance with embodiments of the present disclosure.

FIG. 9 illustrates an example of a timing diagram 900 during a read operation that supports dynamic reference voltage determination in accordance with various embodiments of the present disclosure. Timing diagram 900 includes voltage represented on axis 905 and time represented on axis 910, and timing diagram 900 depicts an exemplary read operation of circuit 800. Each tick mark on axis 905 represents 0V for the voltage of the corresponding node. The read operation depicted in timing diagram 900 discharges memory cells 105 onto their respective digit lines 115.

The read operation includes activating and deactivating various transistors 405 and 410 in circuit 800. For example, a magnitude of A1 may be applied so that the threshold value of transistor 405-*a* is overcome (i.e., transistor 405-*a* is activated) and so that the threshold value of transistor 410-*a* is not overcome (i.e., transistor 410-*a* is deactivated). Activating transistor 405-*a* establishes a conductive path between plate line 210-*a* and VCC and deactivating transistor 410-*a* isolates plate line 210-*a* from GND. Thus, the voltage at plate line 210-*a* is VCC. To apply a positive voltage across memory cell 105-*b*, digit line 115-*b* is floated.

For example, a magnitude of C1 may be applied so that the threshold voltage of transistor 405-*b* is not overcome (i.e., transistor 405-*b* is deactivated) and digit line 115-*b* is isolated from VCC. Additionally, a magnitude of B1 may be applied to transistor 410-*b* so that the threshold voltage of transistor 410-*b* is not overcome (i.e., transistor 410-*b* is deactivated) and digit line 115-*b* is isolated from GND. Thus, the voltage at digit line 115-*b* may be VCC minus the charge stored by memory cell 105-*b*, which corresponds to a logic 0.

To read memory cell 105-*c*, a positive voltage may be applied to memory cell 105-*c*. For example, a magnitude of A2 may be applied so that the threshold value of transistor 405-*d* is overcome (i.e., transistor 405-*d* is activated) and so that the threshold value of transistor 410-*d* is not overcome (i.e., transistor 410-*d* is deactivated). Activating transistor 405-*d* establishes a conductive path between plate line 210-*b* and VCC and deactivating transistor 410-*d* isolates cell plate 210-*b* from GND. Thus, the voltage at plate line 210-*b* is VCC. To apply a positive voltage across digit line 115-*c*, digit line 115-*c* may be floated. For example, a magnitude of C2 may be applied so that the threshold voltage of transistor 405-*c* is not overcome (i.e., transistor 405-*c* is deactivated) and digit line 115-*c* is isolated from VCC. Additionally, a magnitude of B2 may be applied so that the threshold voltage of transistor 410-*c* is not overcome (i.e., transistor 410-*c* is deactivated) and digit line 115-*c* is isolated from GND. Thus, the voltage at digit line 115-*c* may be VCC minus the charge stored by memory cell 105-*c*, which corresponds to a logic 1.

A magnitude of EQISO may be applied so that the respective threshold voltages of transistor 410-*e* and transistor 410-*g* are overcome (i.e., transistor 410-*e* and transistor 410-*g* are activated). Thus, the voltage at node 415-*a* may be the voltage at digit line 115-*b* and the voltage at node 415-*b* may be the voltage at digit line 115-*c*. That is, VrefA 915 may increase to a value of VCC minus the charge stored by memory cell 105-*b* and VrefB 920 may increase to a value of VCC minus the charge stored by memory cell 105-*c*. These voltages may correspond to the logic states, or values, stored by memory cells 105. That is, the voltage at 415-*a* may correspond to a logic 0 and the voltage at node 415-*b* may correspond to a logic 1. A sample operation may be used to generate a new voltage that is between the voltage on node 415-*a* and the voltage on node 415-*b*. The new voltage may be used to adjust or determine a reference voltage for use by other components.

Figure 10:
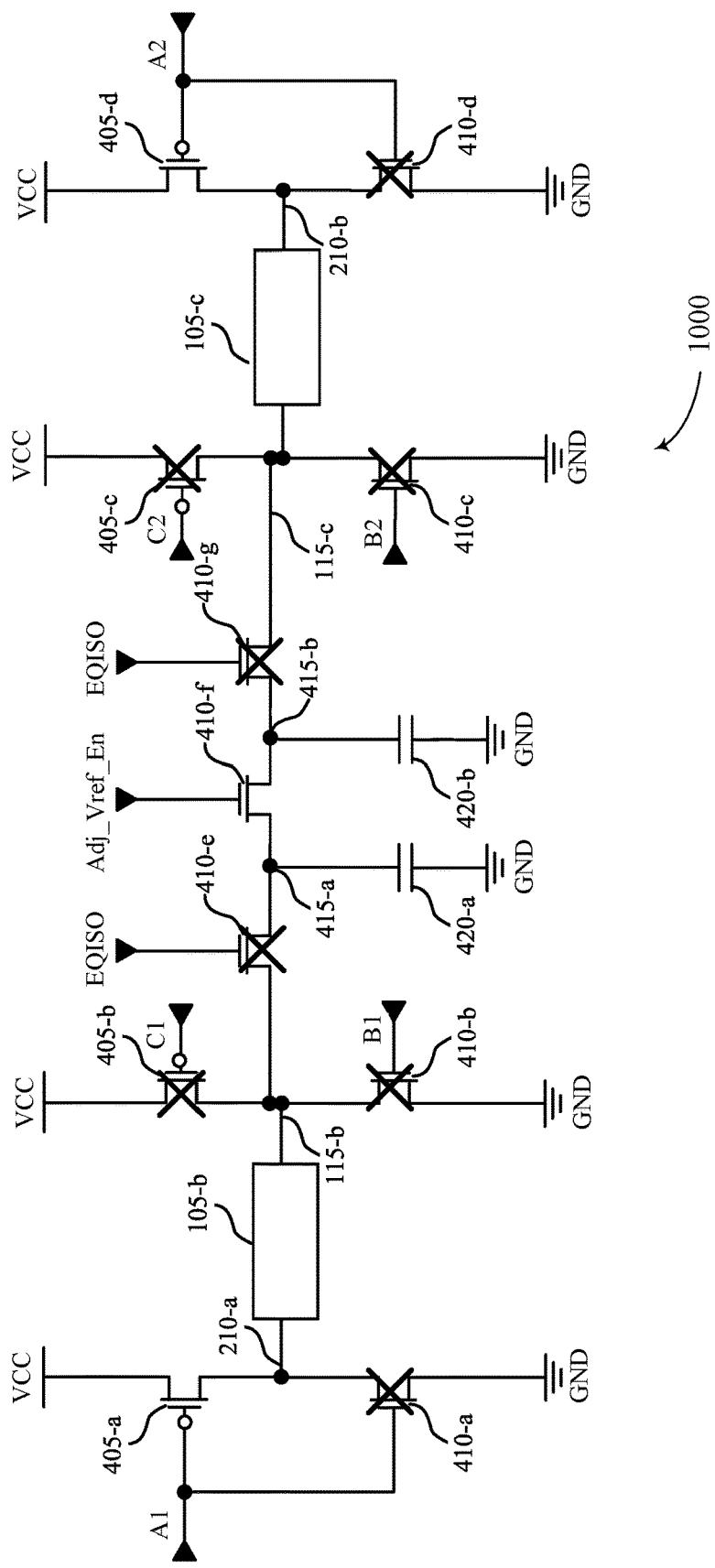
FIG. 10 illustrates an example circuit during a sample operation that supports dynamic reference voltage determination in accordance with embodiments of the present disclosure.

FIG. 10 illustrates an example circuit 1000 during a sample operation that supports dynamic reference voltage determination in accordance with various embodiments of the present disclosure. Circuit 1000 may be part of a memory array that generates a voltage that can be used to adjust a reference voltage (e.g., for use at a different memory array). Circuit 1000 includes a number of components, the states of which (e.g., whether they are activated or deactivated) are shown with a strike through (i.e., an "X") of components that are deactivated and no strike through of components that are activated. The states of the components shown in circuit 1000 may correspond to a sample operation that occurs subsequent write, pre-charge, and read operations of the circuit 1000, such as described with reference to FIGS. 4-9. Thus, the voltage at node 415-*a* may correspond to a logic 0 and the voltage at node 415-*b* may correspond to logic 1. The waveforms used to perform a sample operation on circuit 1000 are shown in FIG. 11 and described in the corresponding discussion.

During the sample operation, node 415-*a* may be isolated from digit line 115-*b* by deactivating transistor 410-*e* and node 415-*b* may be isolated from digit line 115-*c* by deactivating transistor 410-*g*. Also during the sample operation, a conductive path may be established between node 415-*a* and node 415-*b* by activating transistor 410-*f*. Due to the initial difference in voltage between node 415-*a* and node 415-*b*, charge-sharing may occur between node 415-*a* and node 415-*b* after activation of transistor 410-*f*. The resulting voltage at node 415-*a* and node 415-*b* may settle at a value between the initial voltages on the nodes 415 (e.g., the voltage on node 415-*a* which corresponded to a logic 0 and the voltage on node 415-*b* that corresponded to a logic 1). This voltage may be used to adjust a reference voltage.

Figure 11:
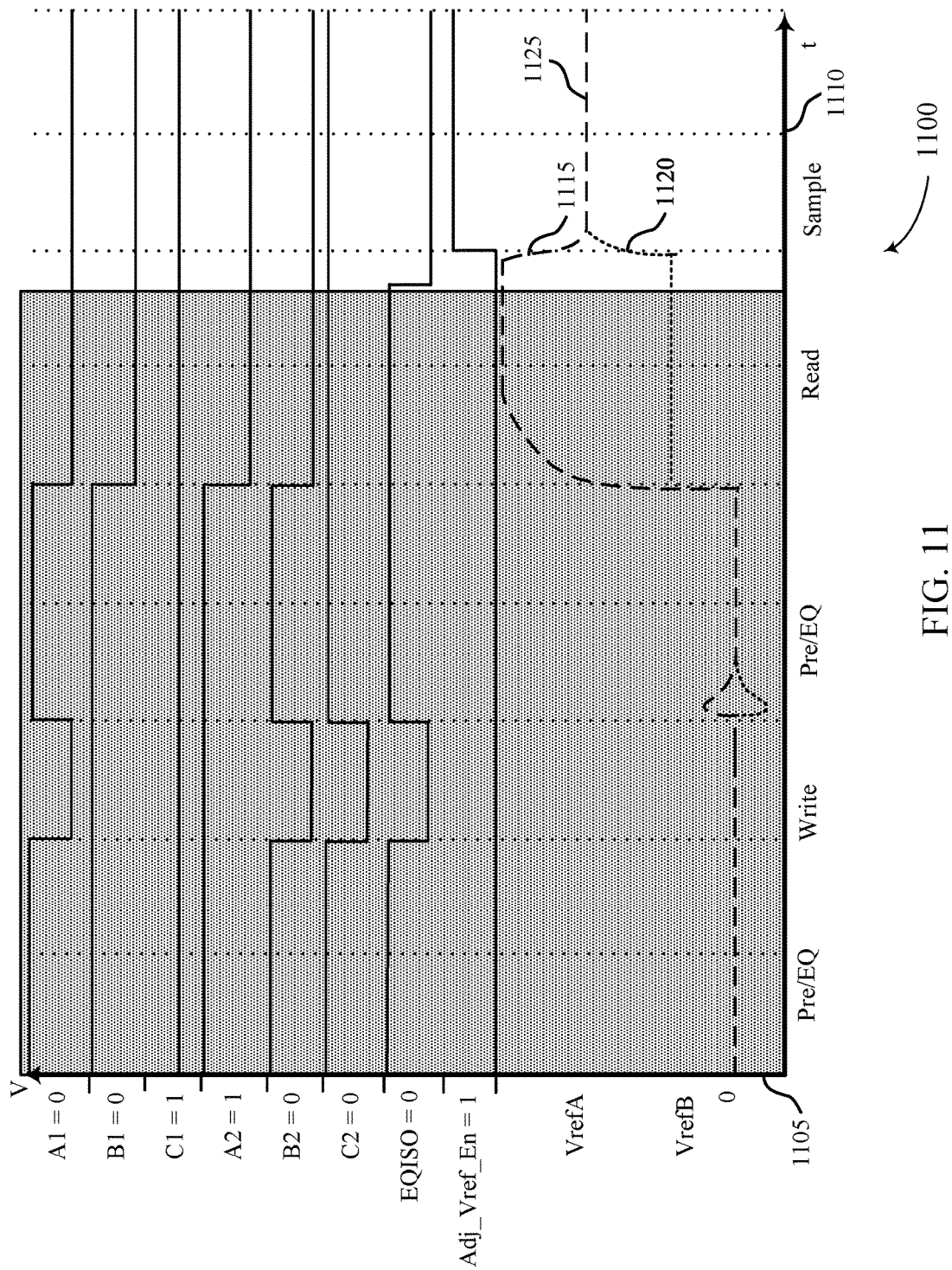
FIG. 11 illustrates an example of a timing diagram a sample operation that supports dynamic reference voltage determination in accordance with embodiments of the present disclosure.

FIG. 11 illustrates an example of a timing diagram 1100 during a sample operation that supports dynamic reference voltage determination in accordance with various embodiments of the present disclosure. Timing diagram 1100 includes voltage represented on axis 1105 and time represented on axis 1110, and timing diagram 1100 depicts an exemplary sample operation of circuit 1000. Each tick mark on axis 1105 represents 0V for the voltage of the corresponding node. The sample operation depicted in timing diagram 1100 causes charge-sharing between node 415-*a* and node 415-*b*, which generates a voltage that can be used to adjust a reference voltage.

The sample operation includes activating and deactivating various transistors 405 and 410 in circuit 1000. For example, a magnitude of EQISO may be applied so that neither the threshold value of transistor 410-*e* nor the threshold voltage of transistor 410-*g* is overcome (i.e., transistor 410-*e* and transistor 410-*g* are deactivated). Deactivating transistor 410-*e* isolates node 415-*a* from digit line 115-*b* and deactivating transistor 410-*g* isolates node 415-*b* from digit line 115-*c*. A magnitude of Adj_Vref_En may be applied so that threshold voltage of transistor 410-*f* is overcome (i.e., transistor 410-*f* is activated) and a conductive path is established between node 415-*a* and 415-*b*. Upon establishment of the conductive path, node 415-*a* and node 415-*b* may charge share, which is depicted by VRefA 1115 reducing and VRefB 1120 increasing until equilibrium voltage 1125 is reached. This voltage may be used to tune reference voltages that are used for other components. Equilibrium voltage 1125 may also be referred to herein as an adjustment or tuning voltage.

In some cases, the voltage at the nodes 415 may be sampled more than once between activating and deactivating transistor 410-*f*. That is, the voltage resulting at the nodes 415 may be passed to component outside of circuit 1000 (e.g., for processing) multiple times after transistor 410-*f* has been activated and prior to deactivation of transistor 410-*f*. In some cases, the sampling may be scheduled to occur periodically (e.g., upon expiry of a timer). Alternatively, the sampling may occur upon sensing of a trigger (e.g., detection of a temperature change). In some examples, the sampling may be based on how many read operations have occurred for a memory array external to circuit 1000 (e.g., the sampling may occur every x number of read operations). In other cases, the equilibrium voltage 1125 may be sampled based on errors associated with read operations of an external memory array. For instance, the equilibrium voltage 1125 may be sampled every n number of errors. The timing and frequency of sampling may be controller by a memory controller 140, such as described with reference to FIG. 1.

In some cases, equilibrium voltage 1125 may be refreshed, or restored. For example, aspects of the pre-charge, write, read and sample operations may be repeated to re-generate equilibrium voltage 1125. Such refreshing may prevent or mitigate degeneration of equilibrium voltage 1125. Refreshing of equilibrium voltage 1125 may be periodic or aperiodic. Additionally or alternatively, equilibrium voltage 1125 may be refreshed upon detection of a temperature change. In some cases, refreshing equilibrium voltage 1125 may be based on a number of read operations of an external memory array, or based on a number of errors associated with read operations of the external memory array. Additionally or alternatively, refreshing may be based on the number of times the nodes 415 are sampled.

Figure 12:
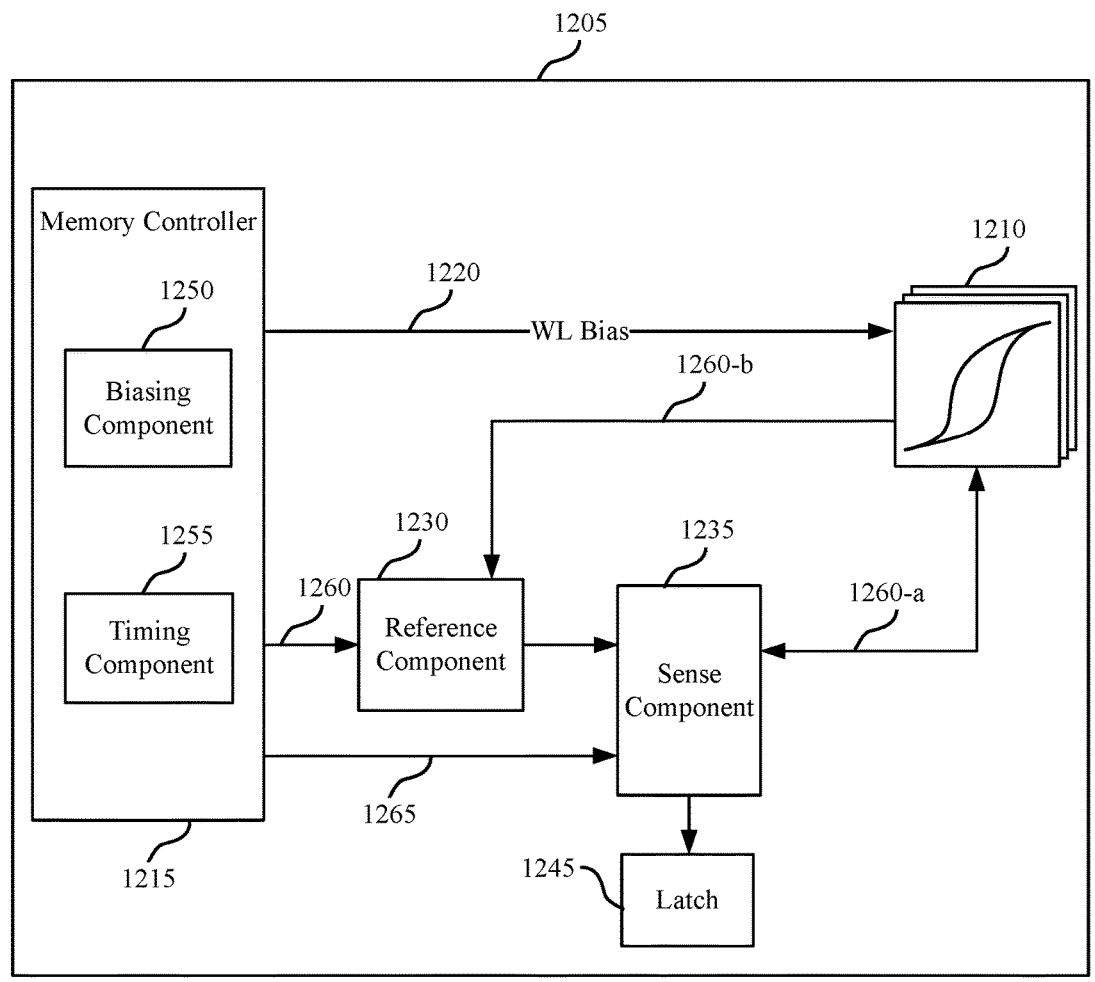
FIGS. 12 and 13 show block diagrams of a device that supports dynamic reference voltage determination in accordance with embodiments of the present disclosure.

FIG. 12 shows a block diagram 1200 of an electronic memory apparatus 1205 that supports that supports dynamic reference voltage determination in accordance with various embodiments of the present disclosure. Electronic memory apparatus 1205 may be referred to as an electronic memory apparatus, and may be an example of a component of a memory array 100 as described with reference to FIG. 1. Alternatively, electronic memory apparatus 1205 may include and/or interact with a memory array 100 such as described with reference to FIG. 1.

Electronic memory apparatus 1205 may include one or more memory cells 1210, a memory controller 1215, a word line 1220, a reference line 1230, a sense component 1235, a digit line 1260, and a latch 1245. These components may be in electronic communication with each other and may perform one or more of the reference voltage determination functions described herein. In some cases, memory controller 1215 may include biasing component 1250 and timing component 1255. Memory controller 1215 may be an example of the memory controller 1315 and the memory controller 1415 described with reference to FIGS. 13 and 14. Memory cells 1210 may include different sets, or arrays, of memory cells. Different sets of memory cells may be access using different access lines (e.g., word lines, plate lines, and/or digit lines). In some cases, a set of memory cells in memory cells 1210 may be responsible for providing a voltage that can be used to adjust a reference voltage used for other sets of memory cells in memory cells 1210.

Memory controller 1215 may be in electronic communication with word line(s) 1220, digit line(s) 1260, and sense component 1235, which may be examples of word line 110, digit line 115, and sense component 125 described with reference to FIGS. 1, and 2. Electronic memory apparatus 1205 may also include reference component 1230 and latch 1245. The components of electronic memory apparatus 1205 may be in electronic communication with each other and may perform aspects of the voltage reference determination functions described with reference to FIGS. 1 through 11. In some cases, reference component 1230, sense component 1235, and latch 1245 may be components of memory controller 1215.

In some examples, digit line 1260 is in electronic communication with sense component 1235 and a ferroelectric capacitor of ferroelectric memory cells 1210. Ferroelectric memory cell(s) 1210 may be writable with logic states (e.g., a first logic state representative of a logic 0 or second logic state representative of a logic 1). Word line(s) 1220 may be in electronic communication with memory controller 1215 and selection components of ferroelectric memory cell(s) 1210. Sense component 1235 may be in electronic communication with memory controller 1215, digit line(s) 1260, latch 1245, reference line 1260-*a*, and reference line 1260-*b*. Reference component 1230 may be in electronic communication with memory controller 1215, reference line 1260-*a*, and reference line 1260-*b*. Reference line 1260-*b* may be in electronic communication with a node such as a node 415 as described with reference to FIGS. 4-11. Thus, a voltage generated by a set (e.g., an array) of memory cells included in memory cells 1210 may be passed from the set of memory cells to reference component 1230 and/or sense component 1235. Sense control line 1265 may be in electronic communication with sense component 1235 and memory controller 1215. These components may also be in electronic communication with other components, both inside and outside of electronic memory apparatus 1205, in addition to components not listed above, via other components, connections, or busses.

Memory controller 1215 may be configured to activate word line(s) 1220 or digit line(s) 1260 by applying voltages to those various nodes. For example, biasing component 1250 may be configured to apply a voltage to operate memory cell(s) 1210 to read or write memory cell(s) 1210 as described above. In some cases, memory controller 1215 may include a row decoder, column decoder, or both, as described with reference to FIG. 1. This may enable memory controller 1215 to access one or more memory cells 105. Biasing component 1250 may also provide voltage potentials to reference component 1230 in order to generate a reference signal for sense component 1235. Additionally, biasing component 1250 may provide voltage potentials for the operation of sense component 1235.

In some cases, memory controller 1215 may perform its operations using timing component 1255. For example, timing component 1255 may control the timing of the various word line selections or plate biasing, including timing for switching and voltage application to perform the memory functions, such as reading and writing, discussed herein. In some cases, timing component 1255 may control the operations of biasing component 1250.

Reference component 1230 may include various components to generate a reference signal for sense component 1235. Reference component 1230 may include circuitry configured to produce a reference signal. In some cases, reference component 1230 may be implemented using other ferroelectric memory cells 105. As described herein, reference component 1230 may determine a reference voltage using a voltage generated by cells included in memory cells 1210. For example, reference component 1230 may increase or decrease an existing reference voltage based on voltage that is output from memory cells 1210. The output voltage may be passed directly or indirectly to reference component 1230. Sense component 1235 may compare a signal from a memory cell 1210 (through digit line 1260) with a reference signal (e.g., reference voltage) from reference component 1230. Upon determining the logic state, the sense component may then store the output in latch 1245, where it may be used in accordance with the operations of a device that electronic memory apparatus 1205 is a part. Sense component 1235 may include a sense amplifier in electronic communication with the latch and the ferroelectric memory cell.

Memory controller 1215 may activate a first set of transistors during a first write operation associated with a first ferroelectric memory cell and activate a second set of transistors during a second write operation associated with a second ferroelectric memory cell. Memory controller 1215 may also activate a transistor after a first read operation of the first ferroelectric memory cell and a second read operation of the second ferroelectric memory cell. In some cases, memory controller 1215 may sample a voltage of a node that is shared by the first ferroelectric memory cell and the second ferroelectric memory cell during activation of the transistor.

In some cases, memory controller 1215 may also activate a third set of transistors during a read operation after the first and second write operations. Memory controller 1215 may, in some examples, detect a trigger condition and, in response to the detection, activate a third set of transistors during a third write operation associated with the first ferroelectric memory cell and activate a fourth set of transistors during a fourth write operation associated with the second ferroelectric memory cell. The third write operation may store a different value at the first ferroelectric memory cell than the first write operation and the fourth write operation may store a different value at the second ferroelectric memory cell than the second write operation. The trigger condition detected by memory controller 1215 may be expiry of a periodic timer or a temperature change. In some cases, the trigger condition may be a number of read operations of a memory array satisfying a threshold. In some cases, the trigger condition may be a number of errors associated with read operations of a memory array satisfying a threshold. Alternatively, the trigger condition may be a number of samplings of the node satisfying a threshold.

Figure 13:
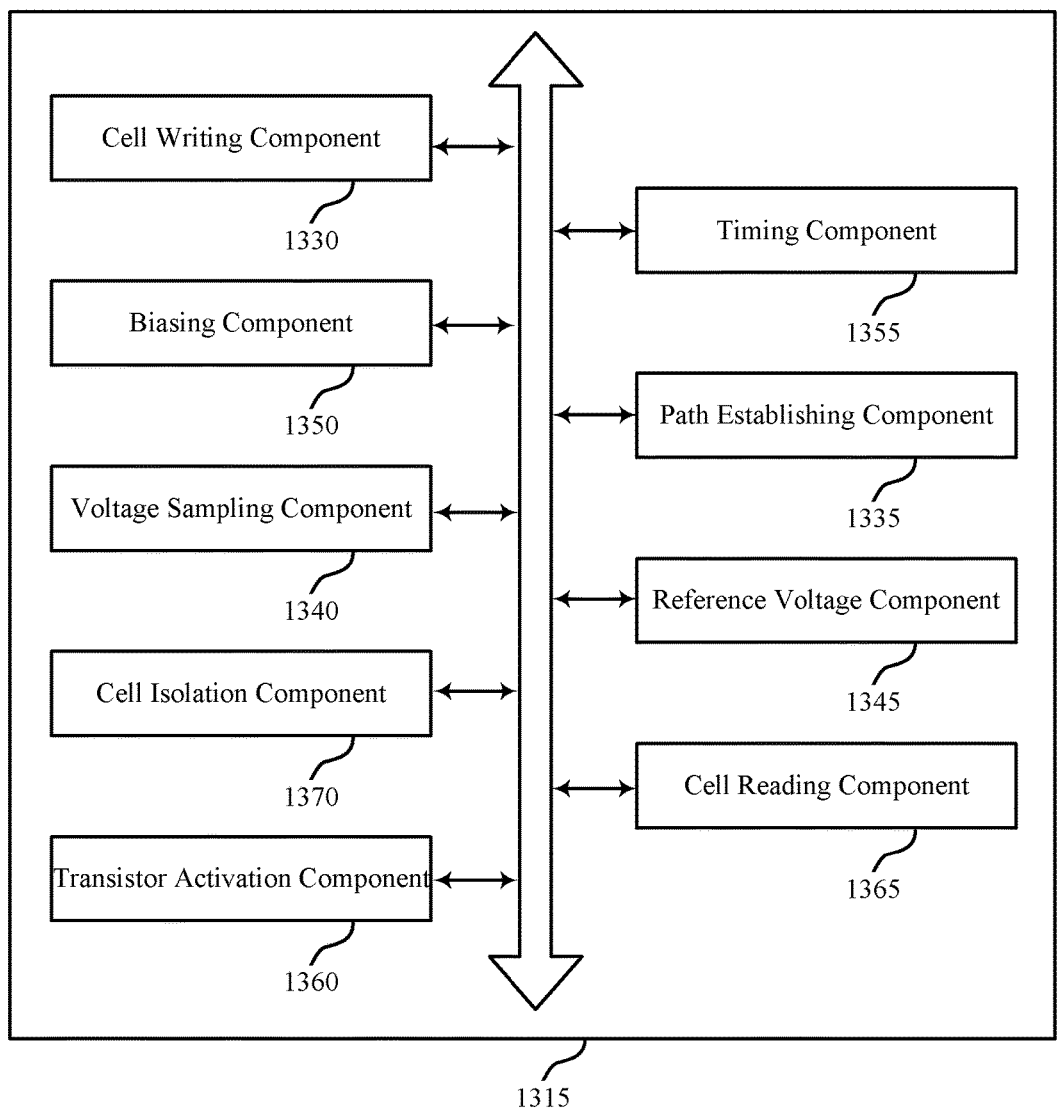

FIG. 13 shows a block diagram 1300 of a memory controller 1315 that supports dynamic reference voltage determination in accordance with various embodiments of the present disclosure. The memory controller 1315 may be an example of a memory controller 1215 or memory controller 1415 as described with reference to FIGS. 12 and 14. The memory controller 1315 may include cell writing component 1330, path establishing component 1335, voltage sampling component 1340, reference voltage component 1345, cell isolation component 1370, cell reading component 1365, transistor activation component 1360, biasing component 1350, and timing component 1355. Biasing component 1350 and timing component 1355 may be examples of biasing component 1250 and timing component 1255 as discussed with reference to FIG. 12. Each of these modules may communicate, directly or indirectly, with one another (e.g., via one or more buses). The various components of memory controller 1315 may be software or firmware modules in some examples.

Cell writing component 1330 may cause a first value to be written to a first ferroelectric memory cell in a first memory array and a second value to be written to a second ferroelectric memory cell in the first memory array. For example, cell writing component 1330 may write the values by triggering various components, such as signal generators and switches, to apply control voltages in the manner described herein. The second value may be different from the first value. In some cases, writing the first value to the first ferroelectric memory cell includes communicating with transistor activation component 1360 to activate a first transistor in electronic communication with a plate line of first ferroelectric memory cell and a second transistor in electronic communication with a bit line of the first ferroelectric memory cell. Cell writing component 1330 may also cause the second value to be written to the first ferroelectric memory cell and the first value to be written to the second ferroelectric memory cell (e.g., after the first ferroelectric memory cell from the second ferroelectric memory cell, which may occur after sampling the first and second ferroelectric memory cells).

Path establishing component 1335 may cause a conductive path to be established, at a node between the first ferroelectric memory cell and the second ferroelectric memory cell. In some cases, establishing the conductive path includes activating one or more switching components (e.g., transistors) in electronic communication with a digit line of the first ferroelectric memory cell and a digit line of the second ferroelectric memory cell.

Voltage sampling component 1340 may sample a voltage of the node (e.g., by activating a latching circuit) after the conductive path between the first ferroelectric memory cell and the second ferroelectric memory cell is established. In some cases, the voltage of the node is a value between a first voltage associated with the first value and a second voltage associated with the second value. In some cases, sampling the voltage of the node includes periodic sampling, sampling upon detection of a temperature change, sampling based on a number of read operations of the second memory array, or sampling based on a number of errors associated with read operations of the second memory array. In some cases, voltage sampling component 1340 may refresh the voltage of the node. Refreshing may include periodic refreshing, refreshing upon detection of a temperature change, refreshing based on a number of read operations of the second memory array, refreshing based on a number of errors associated with read operations of the second memory array, or refreshing based on a number of samplings of the node.

Reference voltage component 1345 may determine a reference voltage of a second memory array based at least in part the sampled voltage of the node (e.g., by comparing the sampled voltage via a comparator and running a portion of the sampled voltage through a summing amplifier or a difference amplifier). Cell isolation component 1370 may isolate the first ferroelectric memory cell from the second ferroelectric memory cell after sampling. In some cases, cell isolation component 1370 is a switching device (e.g., a transistor). Cell reading component 1365 may read the first ferroelectric memory cell and the second ferroelectric memory cell before the conductive path between the first ferroelectric memory cell and the second ferroelectric memory cell is established. Cell reading component 1365 may read the memory cells by triggering various components, such as signal generators and switches, to apply control voltages in the manner described herein, and by activating a sense component. Cell reading component 1365 may also deactivate a first transistor and a second transistor in electronic communication with a digit line of the first ferroelectric memory cell (e.g., by activating one or more signal generators and complementary switches). In some cases, reading the first ferroelectric memory cell includes applying a voltage to a plate line of the first ferroelectric memory cell.

Transistor activation component 1360 may deactivate a third transistor in electronic communication with the plate line of first ferroelectric memory cell and a fourth transistor in electronic communication with the bit line of the first ferroelectric memory cell (e.g., by activating one or more signal generators and complementary switches). In some cases, the first transistor and the third transistor are connected in series and the second transistor and the fourth transistor are connected in series. Transistor activation component 1360 may also activate a transistor after a first read operation of the first ferroelectric memory cell and a second read operation of the second ferroelectric memory cell (e.g., by activating one or more signal generators and complementary switches). In some cases, transistor activation component 1360 may activate a third set of transistors during a third write operation associated with the first ferroelectric memory cell and activate a fourth set of transistors during a fourth write operation associated with the second ferroelectric memory cell. In such cases, the third write operation may store a different value at the first ferroelectric memory cell than the first write operation and the fourth write operation may store a different value at the second ferroelectric memory cell than the second write operation.

Figure 14:
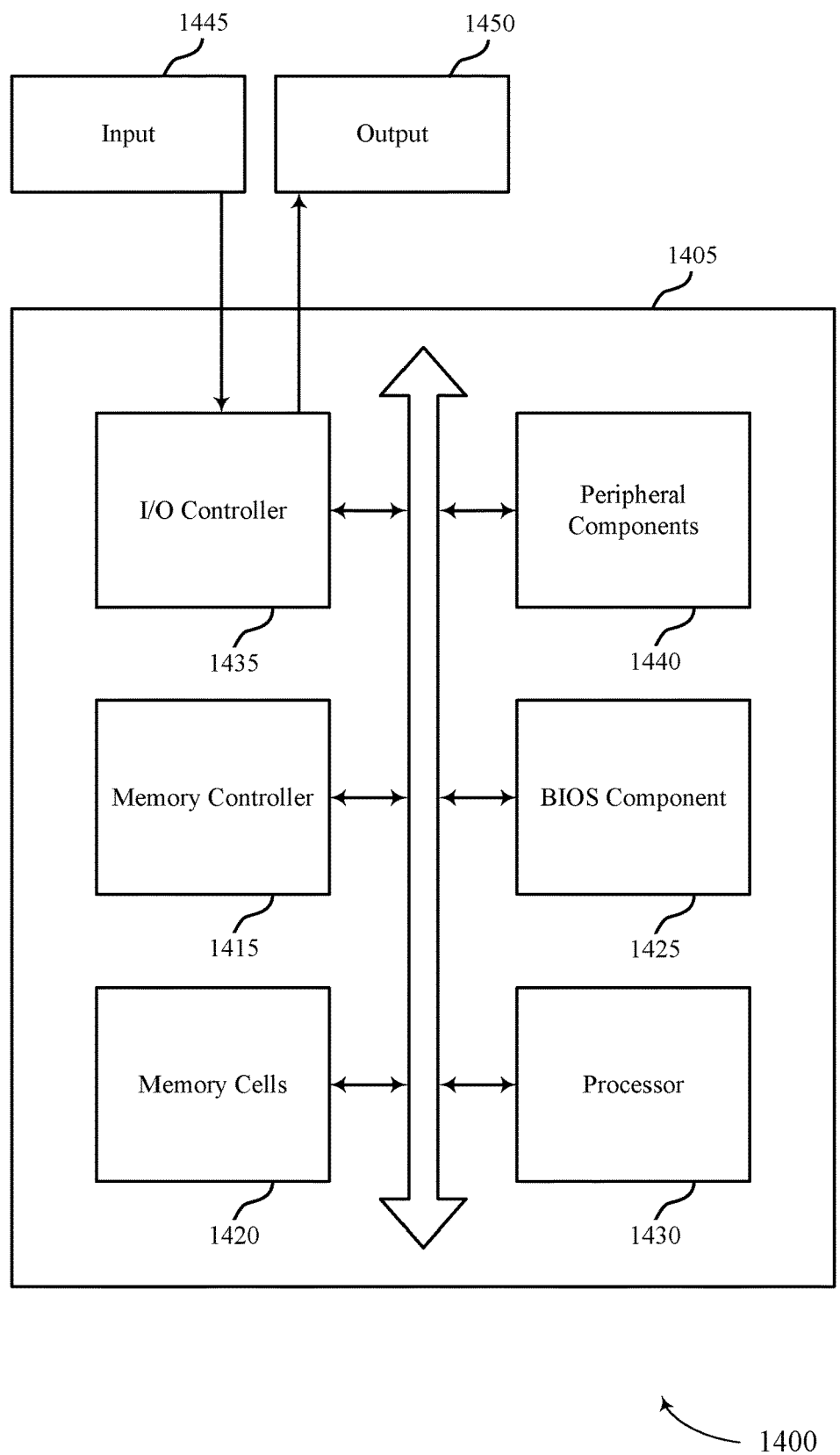
FIG. 14 illustrates a block diagram of a system including a memory array that supports dynamic reference voltage determination in accordance with embodiments of the present disclosure.

FIG. 14 shows a diagram of a system 1400 including a device 1405 that supports dynamic reference voltage adjustment in accordance with various embodiments of the present disclosure. Device 1405 may be an example of or include the components of memory array 100 as described above, e.g., with reference to FIG. 1. Device 1405 may include components for bi-directional voice and data communications including components for transmitting and receiving communications, including memory controller 1415, memory cells 1420, BIOS component 1425, processor 1430, I/O controller 1435, and peripheral components 1440. Device 1405 may be a computer, a server, a laptop computer, a notebook computer, a tablet computer, a mobile phone, a wearable electronic device, a personal electronic device, or the like. Or device 1405 may be a portion or aspect of such a device.

Memory controller 1415 may operate one or more memory cells as described herein. Specifically, memory controller 1415 may be configured to support dynamic reference voltage determination. In some cases, memory controller 1415 may include a row decoder, column decoder, or both, as described with reference to FIG. 1. Memory cells 1420 may store information (e.g., in the form of a logic state) as described herein.

BIOS component 1425 be a software component that includes a basic input/output system (BIOS) operated as firmware, which may initialize and run various hardware components. BIOS component 1425 may also manage data flow between a processor and various other components, e.g., peripheral components, input/output control component, etc. BIOS component 1425 may include a program or software stored in read-only memory (ROM), flash memory, or any other non-volatile memory.

Processor 1430 may include an intelligent hardware device, (e.g., a general-purpose processor, a digital signal processor (DSP), a central processing unit (CPU), a microcontroller, an application specific integrated circuit (ASIC), a field-programmable gate array (FPGA), a programmable logic device, a discrete gate or transistor logic component, a discrete hardware component, or any combination thereof). In some cases, processor 1430 may be configured to operate a memory array using a memory controller. In other cases, a memory controller may be integrated into processor 1430. Processor 1430 may be configured to execute computer-readable instructions stored in a memory to perform various functions (e.g., functions or tasks supporting compensating for variations in threshold voltages of selection components).

I/O controller 1435 may manage input and output signals for device 1405 (e.g., input and output signals associated with input 1445 and output 1450). I/O controller 1435 may also manage peripherals not integrated into device 1405. In some cases, I/O controller 1435 may represent a physical connection or port to an external peripheral. In some cases, I/O controller 1435 may utilize an operating system such as iOS®, ANDROID®, MS-DOS®, MS-WINDOWS®, OS/2®, UNIX®, LINUX®, or another known operating system.

Peripheral components 1440 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Figure 15:
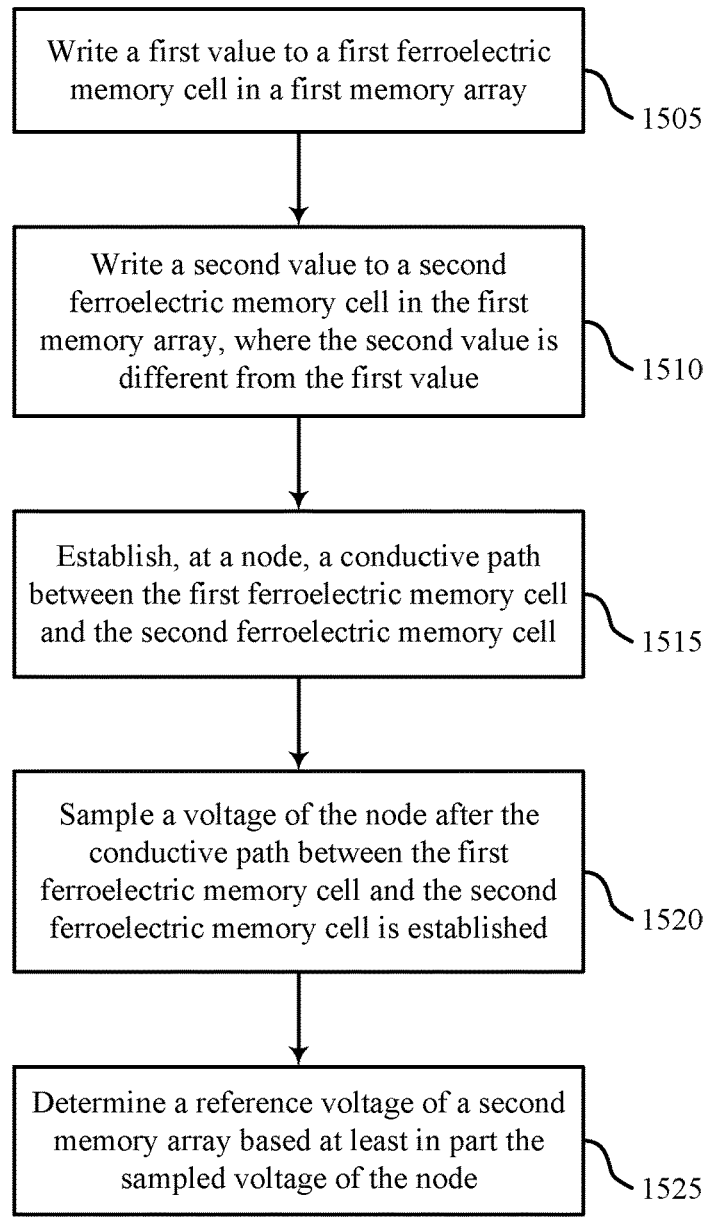
FIGS. 15 through 17 are flowcharts that illustrate a method or methods for dynamic reference voltage determination in accordance with embodiments of the present disclosure.

FIG. 15 shows a flowchart illustrating a method 1500 for dynamic reference voltage determination in accordance with various embodiments of the present disclosure. The operations of method 1500 may be implemented by an electronic memory apparatus 1205 or its components as described herein. For example, the operations of method 1500 may be performed by a memory controller as described with reference to FIGS. 12 through 14. In some examples, an electronic memory apparatus 1205 may execute a set of codes to control the functional elements of the device to perform the functions described below. Additionally or alternatively, the electronic memory apparatus 1205 may perform aspects the functions described below using special-purpose hardware.

At block 1505, the method may include writing a first value to a first ferroelectric memory cell in a first memory array. In some examples, writing the first value to the first ferroelectric memory cell comprises writing the first value to a first plurality of ferroelectric memory cells and writing the second value to the second ferroelectric memory cell comprises writing the second value to a second plurality of ferroelectric memory cells. So establishing the conductive path between the first ferroelectric memory cell and the second ferroelectric memory cell may comprises establishing a conductive path between the first plurality of ferroelectric memory cells and the second plurality of ferroelectric memory cells. In some cases, writing the first value to the first ferroelectric memory cell includes, 1) activating a first transistor in electronic communication with a plate line of first ferroelectric memory cell and a second transistor in electronic communication with a bit line of the first ferroelectric memory cell and 2) deactivating a third transistor in electronic communication with the plate line of first ferroelectric memory cell and a fourth transistor in electronic communication with the bit line of the first ferroelectric memory cell. In some cases, the first transistor and the third transistor are connected in series and the second transistor and the fourth transistor are connected in series. The operations of block 1505 may be performed according to the methods described with reference to FIGS. 4 through 11. In certain examples, aspects of the operations of block 1505 may be performed by a cell writing component as described with reference to FIG. 13.

At block 1510, the method may include writing a second value to a second ferroelectric memory cell in the first memory array. The second value may be different from the first value. The operations of block 1510 may be performed according to the methods described with reference to FIGS. 4 through 11. In certain examples, aspects of the operations of block 1510 may be performed by a cell writing component as described with reference to FIG. 13.

At block 1515, the method may include establishing, at a node, a conductive path between the first ferroelectric memory cell and the second ferroelectric memory cell. In some cases, establishing the conductive path includes activating a transistor in electronic communication with a digit line of the first ferroelectric memory cell and a digit line of the second ferroelectric memory cell. The operations of block 1515 may be performed according to the methods described with reference to FIGS. 4 through 11. In certain examples, aspects of the operations of block 1515 may be performed by a path establishment component as described with reference to FIG. 13.

At block 1520, the method may include sampling a voltage of the node after the conductive path between the first ferroelectric memory cell and the second ferroelectric memory cell is established. In some cases, the voltage of the node is a value between a first voltage associated with the first value and a second voltage associated with the second value. The operations of block 1520 may be performed according to the methods described with reference to FIGS. 4 through 11. In certain examples, aspects of the operations of block 1520 may be performed by a voltage sampling component as described with reference to FIG. 13.

At block 1525, the method may include determining a reference voltage of a second memory array based at least in part the sampled voltage of the node. In some cases, t sampling the voltage of the node includes periodic sampling, sampling upon detection of a temperature change, sampling based at least in part on a number of read operations of the second memory array, or sampling based at least in part on a number of errors associated with read operations of the second memory array. The operations of block 1525 may be performed according to the methods described with reference to FIGS. 4 through 11. In certain examples, aspects of the operations of block 1525 may be performed by a reference voltage component as described with reference to FIG. 13.

In some cases, the method may also include refreshing the voltage of the node. Refreshing the voltage of the node may include periodic refreshing, refreshing upon detection of a temperature change, refreshing based at least in part on a number of read operations of the second memory array, refreshing based at least in part on a number of errors associated with read operations of the second memory array, or refreshing based at least in part on a number of samplings of the node.

Figure 16:
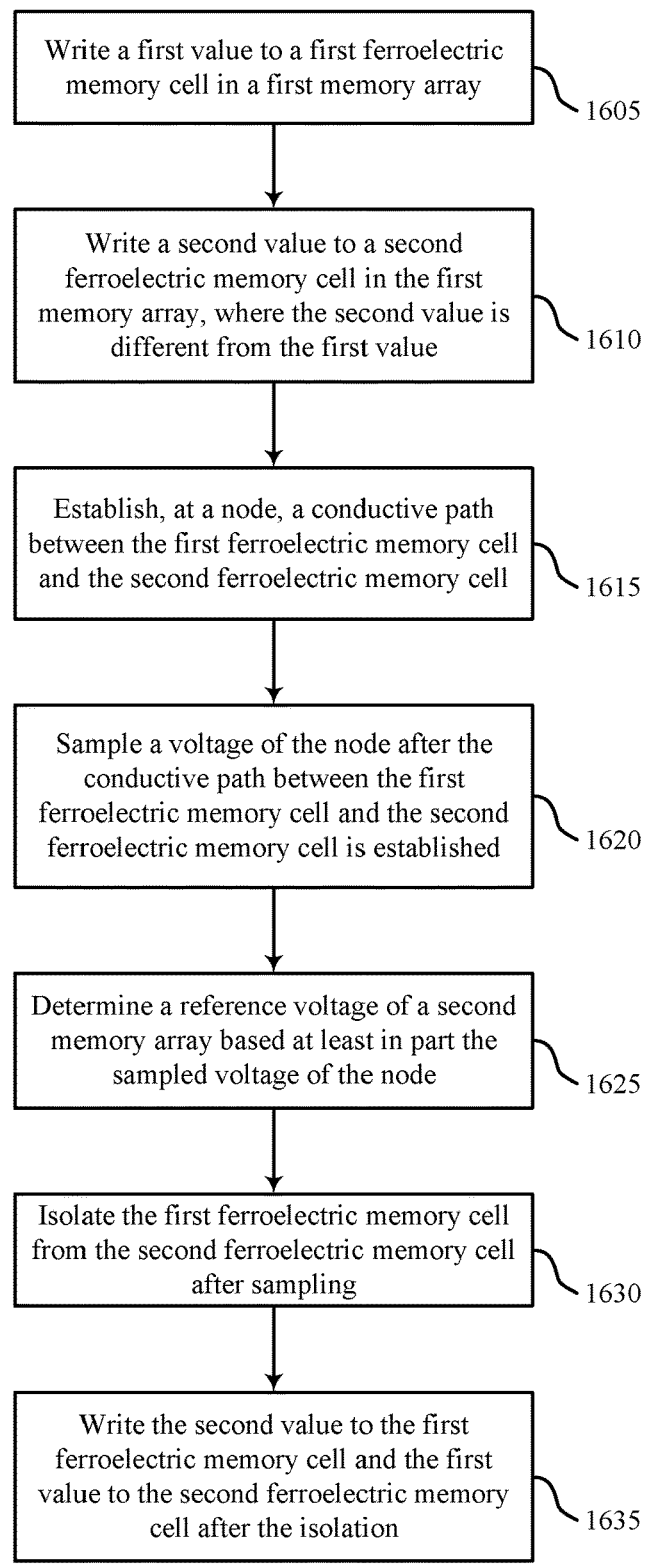

FIG. 16 shows a flowchart illustrating a method 1600 for dynamic reference voltage determination in accordance with various embodiments of the present disclosure. The operations of method 1600 may be implemented by an electronic memory apparatus 1205 or its components as described herein. For example, the operations of method 1600 may be performed by a memory controller as described with reference to FIGS. 12 through 14. In some examples, an electronic memory apparatus 1205 may execute a set of codes to control the functional elements of the device to perform the functions described below. Additionally or alternatively, the electronic memory apparatus 1205 may perform aspects the functions described below using special-purpose hardware.

At block 1605, the method may include writing a first value to a first ferroelectric memory cell in a first memory array. The operations of block 1605 may be performed according to the methods described with reference to FIGS. 4 through 11. In certain examples, aspects of the operations of block 1605 may be performed by a cell writing component as described with reference to FIG. 13.

At block 1610, the method may include writing a second value to a second ferroelectric memory cell in the first memory array. The second value may be different from the first value. The operations of block 1610 may be performed according to the methods described with reference to FIGS. 4 through 11. In certain examples, aspects of the operations of block 1610 may be performed by a cell writing component as described with reference to FIG. 13.

At block 1615, the method may include establishing, at a node, a conductive path between the first ferroelectric memory cell and the second ferroelectric memory cell. In some cases, establishing the conductive path includes activating a transistor in electronic communication with a digit line of the first ferroelectric memory cell and a digit line of the second ferroelectric memory cell. The operations of block 1615 may be performed according to the methods described with reference to FIGS. 4 through 11. In certain examples, aspects of the operations of block 1615 may be performed by a path establishment component as described with reference to FIG. 13.

At block 1620, the method may include sampling a voltage of the node after the conductive path between the first ferroelectric memory cell and the second ferroelectric memory cell is established. The operations of block 1620 may be performed according to the methods described with reference to FIGS. 4 through 11. In certain examples, aspects of the operations of block 1620 may be performed by a voltage sampling component as described with reference to FIG. 13.

At block 1625, the method may include determining a reference voltage of a second memory array based at least in part the sampled voltage of the node. The operations of block 1625 may be performed according to the methods described with reference to FIGS. 4 through 11. In certain examples, aspects of the operations of block 1625 may be performed by a reference voltage component as described with reference to FIG. 13.

At block 1630, the method may include isolating the first ferroelectric memory cell from the second ferroelectric memory cell after sampling. The operations of block 1630 may be performed according to the methods described with reference to FIGS. 4 through 11. In certain examples, aspects of the operations of block 1630 may be performed by a cell isolation component as described with reference to FIG. 13.

At block 1635, the method may include writing the second value to the first ferroelectric memory cell and the first value to the second ferroelectric memory cell after the isolation. The operations of block 1635 may be performed according to the methods described with reference to FIGS. 4 through 12. In certain examples, aspects of the operations of block 1635 may be performed by a cell writing component as described with reference to FIG. 13.

Figure 17:
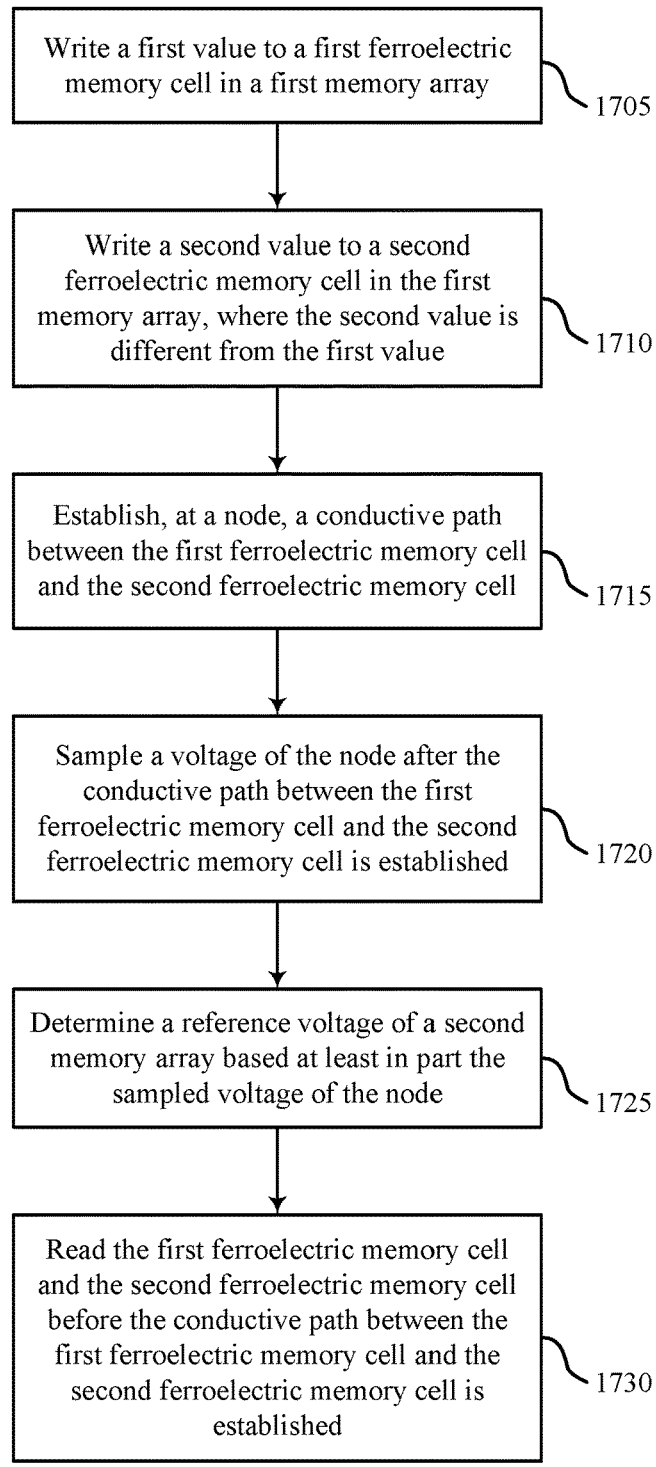

FIG. 17 shows a flowchart illustrating a method 1700 for dynamic reference voltage determination in accordance with various embodiments of the present disclosure. The operations of method 1700 may be implemented by an electronic memory apparatus 1205 or its components as described herein. For example, the operations of method 1700 may be performed by a memory controller as described with reference to FIGS. 12 through 14. In some examples, an electronic memory apparatus 1205 may execute a set of codes to control the functional elements of the device to perform the functions described below. Additionally or alternatively, the electronic memory apparatus 1205 may perform aspects the functions described below using special-purpose hardware.

At block 1705, the method may include writing a first value to a first ferroelectric memory cell in a first memory array. The operations of block 1705 may be performed according to the methods described with reference to FIGS. 4 through 11. In certain examples, aspects of the operations of block 1705 may be performed by a cell writing component as described with reference to FIG. 13.

At block 1710, the method may include writing a second value to a second ferroelectric memory cell in the first memory array. The second value may be different from the first value. The operations of block 1710 may be performed according to the methods described with reference to FIGS. 4 through 11. In certain examples, aspects of the operations of block 1710 may be performed by a cell writing component as described with reference to FIG. 13.

At block 1715, the method may include establishing, at a node, a conductive path between the first ferroelectric memory cell and the second ferroelectric memory cell. In some cases, establishing the conductive path includes activating a transistor in electronic communication with a digit line of the first ferroelectric memory cell and a digit line of the second ferroelectric memory cell. The operations of block 1715 may be performed according to the methods described with reference to FIGS. 4 through 11. In certain examples, aspects of the operations of block 1715 may be performed by a path establishment component as described with reference to FIG. 13.

At block 1720, the method may include sampling a voltage of the node after the conductive path between the first ferroelectric memory cell and the second ferroelectric memory cell is established. The operations of block 1720 may be performed according to the methods described with reference to FIGS. 4 through 11. In certain examples, aspects of the operations of block 1720 may be performed by a voltage sampling component as described with reference to FIG. 13.

At block 1725, the method may include determining a reference voltage of a second memory array based at least in part the sampled voltage of the node. The operations of block 1725 may be performed according to the methods described with reference to FIGS. 4 through 11. In certain examples, aspects of the operations of block 1725 may be performed by a reference voltage component as described with reference to FIG. 13.

At block 1730, the method may include reading the first ferroelectric memory cell and the second ferroelectric memory cell before the conductive path between the first ferroelectric memory cell and the second ferroelectric memory cell is established. In some cases, reading the first ferroelectric memory cell may include applying a voltage to a plate line of the first ferroelectric memory cell and deactivating a first transistor and a second transistor in electronic communication with a digit line of the first ferroelectric memory cell. The operations of block 1730 may be performed according to the methods described with reference to FIGS. 4 through 11. In certain examples, aspects of the operations of block 1730 may be performed by a cell reading component as described with reference to FIG. 13.

It should be noted that the methods described above describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" refers to a relationship between components that supports electron flow between the components. This may include a direct connection between components or may include intermediate components. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the terms "short" and "shorting" refer to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   establishing a conductive path between a first digit line of a first memory cell and a second digit line of a second memory cell; and
   determining, after establishing the conductive path, a reference voltage based at least in part on a first voltage output by the first memory cell on the first digit line and a second voltage output by the second memory cell on the second digit line.

2. The method of claim 1, further comprising:
   reading the first and second memory cells before establishing the conductive path, wherein the first voltage is output in response to reading the first memory cell and the second voltage is output in response to reading the second memory cell.

3. The method of claim 1, further comprising:
   isolating the first digit line from the first memory cell before establishing the conductive path; and
   isolating the second digit line from the second memory cell before establishing the conductive path.

4. The method of claim 3, further comprising:
   deactivating a first transistor coupled with the first memory cell, wherein deactivating the first transistor isolates the first digit line from the first memory cell; and
   deactivating a second transistor coupled with the second memory cell, wherein deactivating the second transistor isolates the second digit line from the second memory cell.

5. The method of claim 1, further comprising:
   activating a transistor coupled with the first digit line and virtual ground;
   writing a first logic state to the first memory cell while the transistor is activated, wherein the first voltage corresponds to the first logic state; and
   reading the first memory cell after deactivating the transistor, wherein the first voltage is output by the first memory cell in response to reading the first memory cell.

6. The method of claim 1, further comprising:
   storing charge from the first memory cell at a first capacitor coupled with the first digit line, wherein the first voltage is based at least in part on the charge from the first memory cell; and
   storing charge from the second memory cell at a second capacitor coupled with the second digit line, wherein the second voltage is based at least in part on the charge from the second memory cell.

7. The method of claim 6, further comprising:
   activating a transistor coupled with the first capacitor and the second capacitor, wherein activating the transistor establishes the conductive path between the first capacitor and the second capacitor.

8. An electronic memory apparatus, comprising:
   a first memory cell comprising a first digit line coupled with a first switching component;
   a second memory cell comprising a second digit line coupled with a second switching component; and
   a third switching component in series with the first and second switching components.

9. The electronic memory apparatus of claim 8, further comprising:
   a first capacitor coupled with the first switching component and the third switching component; and
   a second capacitor coupled with the second switching component and the third switching component.

10. The electronic memory apparatus of claim 9, wherein the first capacitor and the second capacitor are configured to be in parallel when the third switching component is activated.

11. The electronic memory apparatus of claim 9, further comprising:
    a fourth switching component coupled with the first memory cell and the first switching component, the fourth switching component configured to be in parallel with the first capacitor when the first switching component is activated;
    a fifth switching component coupled with the second memory cell and the second switching component, the fifth switching component configured to be in parallel with the second capacitor when the second switching component is activated.

12. The electronic memory apparatus of claim 8, further comprising:
    a fourth switching component coupled with a plate line of the first memory cell and virtual ground; and
    a fifth switching component coupled with the first digit line of the first memory cell and virtual ground.

13. The electronic memory apparatus of claim 12, further comprising:
    a sixth switching component coupled with the plate line of the first memory cell and a voltage supply, the sixth switching component in series with the fourth switching component.

14. An electronic memory apparatus, comprising:
    a first memory cell comprising a first digit line;
    a second memory cell comprising a second digit line; and a controller coupled with the first memory cell and the second memory cell, wherein the controller is operable to:

activate a first switching component coupled with the first and second digit lines; and determine a reference voltage based at least in part on a voltage of a conductive path, wherein the conductive path is established between the first and second digit lines when the first switching component is activated.

15. The electronic memory apparatus of claim 14, further comprising:

a second switching component electrically separating the first digit line from the first memory cell; and a third switching component electrically separating the second digit line from the second memory cell.

16. The electronic memory apparatus of claim 15, wherein the controller is further operable to:

deactivate the second switching component before activating the first switching component; and deactivate the third switching component before activating the first switching component.

17. The electronic memory apparatus of claim 15, wherein the controller is further operable to:

deactivate the second and third switching components during a write operation on the first and second memory cells; and activate the second and third switching components during a read operation on the first and second memory cells, wherein the voltage of the conductive path is based at least in part on the read operation.

18. The electronic memory apparatus of claim 14, further comprising a second switching component coupled with the first digit line and virtual ground, wherein the controller is further operable to:

activate the second switching component while a write operation is performed on the first memory cell; and deactivate the second switching component while a read operation is performed on the first memory cell.

19. The electronic memory apparatus of claim 14, further comprising:

a first capacitor coupled with the first digit line; and a second capacitor coupled with the second digit line, the first and second capacitors electrically separated by the first switching component.

20. The electronic memory apparatus of claim 19, further comprising:

a second switching component coupled with the first digit line, the second switching component electrically separating the first capacitor from the first memory cell; and a third switching component coupled with the second digit line, the third switching component electrically separating the second capacitor from the second memory cell.

* * * * *